US012747153B2

(12) United States Patent
Chang et al.

(10) Patent No.: US 12,747,153 B2
(45) Date of Patent: Sep. 29, 2026

(54) COMPOSITE SPRING STRUCTURE TO REINFORCE MECHANICAL ROBUSTNESS OF A MEMS DEVICE

(71) Applicant: Taiwan Semiconductor Manufacturing Company, Ltd., Hsinchu (TW)

(72) Inventors: Kuei-Sung Chang, Kaohsiung City (TW); Shang-Ying Tsai, Pingzhen City (TW); Wei-Jhih Mao, Taipei City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 67 days.

(21) Appl. No.: 18/642,889

(22) Filed: Apr. 23, 2024

(65) Prior Publication Data

US 2024/0270565 A1 Aug. 15, 2024

Related U.S. Application Data

(60) Continuation of application No. 17/840,936, filed on Jun. 15, 2022, now Pat. No. 11,993,510, which is a (Continued)

(51) Int. Cl.

*B81B 3/00* (2006.01)
*B81C 1/00* (2006.01)

(52) U.S. Cl.

CPC .......... *B81B 3/0054* (2013.01); *B81C 1/0019* (2013.01); *B81B 2203/0163* (2013.01);

(Continued)

(58) Field of Classification Search

CPC ................ B81B 3/0013; B81B 3/0027; B81B 2203/0163; B81B 3/0054;

(Continued)

(56) References Cited

U.S. PATENT DOCUMENTS 5,420,688 A 5/1995 Farah
5,903,380 A 5/1999 Motamedi et al.

(Continued)

FOREIGN PATENT DOCUMENTS

| | | | |
|---|---|---|---|
| CH | 709730 | A2 | 12/2015 |
| CN | 1643741 | A | 7/2005 |
| DE | 102009026639 | A1 | 12/2010 |

OTHER PUBLICATIONS

Notice of Allowance dated Apr. 13, 2022 for U.S. Appl. No. 16/826,550.

(Continued)

*Primary Examiner* — Moazzam Hossain
(74) *Attorney, Agent, or Firm* — Eschweiler & Potashnik, LLC

(57) ABSTRACT

Various embodiments of the present disclosure are directed towards a semiconductor structure comprising a spring structure. A first substrate underlies a second substrate. The first and second substrates at least partially define a cavity. A microelectromechanical systems (MEMS) component is arranged in the cavity. The spring structure is disposed between a region of the second substrate and the MEMS component. The spring structure comprises a first layer and a second layer. The first layer continuously extends along a first vertical surface of the second layer.

20 Claims, 31 Drawing Sheets

Related U.S. Application Data division of application No. 16/826,550, filed on Mar. 23, 2020, now Pat. No. 11,420,866.

(52) U.S. Cl.
CPC ................. *B81C 2201/0125* (2013.01); *B81C 2201/0132* (2013.01)

(58) Field of Classification Search
CPC .... B81B 2201/0235; B81B 2201/0242; B81B 2201/0257; B81B 2201/0264; B81B 2207/012; B81B 3/0075; B81B 3/0067; B81B 7/02; B81B 2201/045; B81B 2201/05; B81B 3/0035; H01L 24/90; H01L 2224/90; H01L 24/72; H01L 2224/72
See application file for complete search history.

(56) References Cited

U.S. PATENT DOCUMENTS

| | | | | |
|---|---|---|---|---|
| 2003/0117158 | A1 | 6/2003 | Goldbach et al. | |
| 2007/0075715 | A1* | 4/2007 | Khandros | H05K 3/4015 324/762.05 |
| 2010/0301433 | A1 | 12/2010 | Wu et al. | |
| 2011/0159627 | A1 | 6/2011 | Mantravadi et al. | |
| 2011/0265574 | A1 | 11/2011 | Yang | |
| 2013/0285164 | A1 | 10/2013 | Saito et al. | |
| 2014/0024162 | A1* | 1/2014 | Koury, Jr. | B81C 1/00142 438/53 |
| 2014/0245832 | A1 | 9/2014 | Lin et al. | |
| 2015/0021719 | A1* | 1/2015 | Tanaka | B81B 3/0021 257/415 |
| 2015/0054101 | A1* | 2/2015 | Reinmuth | B81B 3/0078 257/420 |
| 2015/0344300 | A1 | 12/2015 | Hessler | |
| 2016/0318758 | A1* | 11/2016 | Chou | B81C 1/00619 |
| 2017/0107100 | A1 | 4/2017 | Cheng et al. | |
| 2017/0129772 | A1 | 5/2017 | Cheng et al. | |
| 2017/0305740 | A1 | 10/2017 | Zunft | |
| 2018/0252744 | A1 | 9/2018 | Kamada et al. | |
| 2019/0084825 | A1 | 3/2019 | Tomizawa et al. | |
| 2019/0161347 | A1 | 5/2019 | Classen | |
| 2019/0322522 | A1* | 10/2019 | Hocking | H10N 30/306 |

OTHER PUBLICATIONS

Comsol. "MEMS Module". The date of publication is unknown. Retrieved online on May 31, 2022 from https://www.comsol.com/mems-module.
Wikipedia.org "Flexural strength" Published on Aug. 8, 2021.
Non-Final Office Action dated Sep. 21, 2023 for U.S. Appl. No. 17/840,936.
Notice of Allowance dated Jan. 31, 2024 for U.S. Appl. No. 17/840,936.

* cited by examiner

COMPOSITE SPRING STRUCTURE TO REINFORCE MECHANICAL ROBUSTNESS OF A MEMS DEVICE

REFERENCE TO RELATED APPLICATIONS

This Application is a Continuation of U.S. application Ser. No. 17/840,936, filed on Jun. 15, 2022, which is a Divisional of U.S. application Ser. No. 16/826,550, filed on Mar. 23, 2020 (now U.S. Pat. No. 11,420,866, issued on Aug. 23, 2022). The contents of the above-referenced Patent Applications are hereby incorporated by reference in their entirety.

BACKGROUND

Microelectromechanical systems (MEMS) is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses, etc.), pressure sensors, micro-fluidic elements (e.g., valves, pumps), optical switches (e.g., mirrors), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
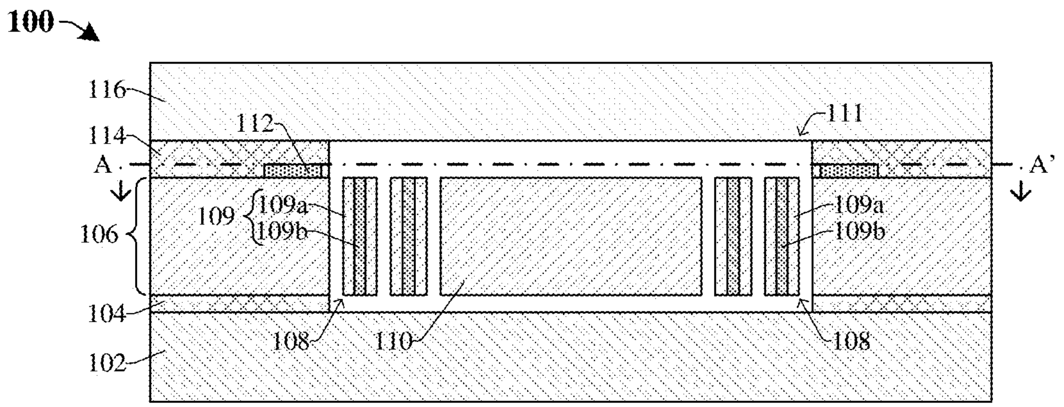
FIG. 1 illustrates a cross-sectional view of some embodiments of a microelectromechanical systems (MEMS) structure including composite springs and a moveable mass within a cavity.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical systems (MEMS) device may include a MEMS substrate. The MEMS substrate includes one or more springs and a moveable mass disposed within a cavity. The MEMS substrate may be disposed between a carrier substrate and a capping substrate, such that the cavity is defined between the carrier and capping substrates. The moveable mass is attached to a peripheral region of the MEMS substrate by way of the springs, such that the springs are configured to suspend the moveable mass within the cavity. During operation of the MEMS device, the moveable mass deflects in proportion to external stimuli, such as motion or sound waves, applied to the moveable mass, whereby the external stimuli can be quantified by measuring the deflection. The springs are configured to provide the moveable mass with motion such that they may stretch and/or compress from the peripheral region of the MEMS substrate. Thus, the deflection of the moveable mass may be measured by a change in capacitance between a moveable sensing electrode disposed upon the moveable mass and a fixed sensing electrode that neighbors the moveable sensing electrode.

The springs may each comprise a single continuous material extending from the peripheral region of the MEMS substrate to the moveable mass. For example, the single continuous material may be polysilicon. In such embodiments, when the moveable mass deflects in response to the external stimuli the springs are bent. By virtue of the springs comprising polysilicon, the springs may be relatively thin (e.g., less than about 30 micrometers), such that stress induced upon the springs by the bending is high. This may result in the springs breaking, thereby causing device failure. In another example, the single continuous material may be silicon (e.g., monocrystalline silicon, single-crystal silicon, etc.). By virtue of the springs comprising single-crystal silicon, the springs may be relatively thick (e.g., greater than 30 micrometers), such that the springs may endure a higher degree of bending stress before breaking. However, because single-crystal silicon comprises a single uniform crystal orientation (e.g., a 100 crystal orientation), if a small crack occurs at the surface of the springs, then the crack may propagate through the crystal lattice of the springs. This may result in the springs breaking, thereby causing device failure.

Accordingly, the present disclosure relates to a MEMS device including a composite spring structure and a moveable mass within a cavity, as well as associated methods for forming the MEMS device. For example, the MEMS device includes a MEMS substrate disposed between a carrier substrate and a capping substrate, such that the cavity is defined between the carrier and capping substrates. The moveable mass is suspended within the cavity by way of the composite spring structure. The composite spring structure may comprise one or more composite springs that each extend from a peripheral region of the MEMS substrate to the moveable mass. The composite springs each include a first spring layer that comprises a first material (e.g., single-crystal silicon) and a second spring layer that comprises a second material (e.g., polysilicon) different than the first material. The first and second spring layers are configured to increase a bending stress the composite springs may endure before breaking. For example, if a crack occurs on a surface of the first spring layer as a result of bending stress, the crack may propagate through the first spring layer and stop at the second spring layer. This, in part, is because the second spring layer may, for example, have a different crystal orientation than the first spring layer. Thus, the composite spring structure is configured to increase an endurance, reliability, and performance of the MEMS device.

FIG. 1 illustrates a cross-sectional view of some embodiments of a microelectromechanical systems (MEMS) structure 100 including composite springs 108 and a moveable mass 110 within a cavity 111.

The MEMS structure 100 includes a MEMS substrate 106 disposed between a carrier substrate 102 and a capping substrate 116. In some embodiments, the carrier substrate 102 and/or the capping substrate 116 may, for example, be or comprise a bulk semiconductor substrate, such as a bulk silicon substrate, or a silicon-on-insulator (SOI) substrate, a complementary metal-oxide-semiconductor (CMOS) wafer with an integrated circuit (not shown), a wafer with integrated passive devices (not shown), or a wafer with a CMOS image sensor (not shown), or a wafer with through substrate vias (TSVs), another similar substrate with other semiconductor devices, or any combination of the foregoing. In further embodiments, the MEMS substrate 106 may, for example, be or comprise monocrystalline silicon (i.e., single-crystal silicon), intrinsic monocrystalline silicon, a bulk silicon substrate, an SOI substrate, another suitable semiconductor material, or the like. A lower bonding structure 104 is disposed between the carrier substrate 102 and the MEMS substrate 106. An upper bonding structure 114 is disposed between the capping substrate 116 and the MEMS substrate 106. A cavity 111 is defined between the carrier substrate 102 and the capping substrate 116.

The MEMS structure 100 may, for example, be configured as a motion sensor, a pressure sensor, a microphone, an actuator, or another suitable device. In some embodiments, the MEMS substrate 106 includes composite springs 108 and the moveable mass 110 (e.g., a proof mass) disposed within the cavity 111. The composite springs 108 connect the moveable mass 110 to a peripheral region of the MEMS substrate 106 (e.g., to one or more anchor structures defined by the MEMS substrate 106), and suspend the moveable mass 110 within the cavity 111 and over the carrier substrate 102. During operation, the moveable mass 110 deflects in proportion to external stimuli, such as motion or sound waves, applied to the moveable mass 110, whereby the external stimuli can be quantified by measuring the deflection. In some embodiments, the deflection is measured using capacitive coupling between a moveable sensing electrode (not shown) supported by the moveable mass 110 and a fixed sensing electrode (not shown) neighboring the moveable sensing electrode. In such embodiments, the MEMS structure 100 may be configured as an actuator, where the fixed and moveable electrodes (not shown) can provide electrostatic force to move the moveable mass 110. Contact electrodes 112 are disposed over the peripheral region of the MEMS substrate 106 and may be configured to facilitate measuring a change in capacitance between the moveable sensing electrode and the fixed sensing electrode. For example, the contact electrodes 112 may be electrically coupled to the moveable sensing electrode and/or the fixed sensing electrode. Thus, the contact electrodes 112 may be configured to output a signal comprising data related to the deflection of the moveable mass 110.

In some embodiments, the composite springs 108 each comprise a composite structure 109. The composite structure 109 comprises two or more layers that each comprise a different semiconductor material from one another. In some embodiments, the composite structure 109 includes a first spring layer 109*a* and a second spring layer 109*b*. The first spring layer 109*a* may comprise a first semiconductor material (e.g., silicon, monocrystalline silicon, single-crystal silicon, etc.) and the second spring layer 109*b* may comprise a second semiconductor material (e.g., polysilicon) different than the first semiconductor material. In some embodiments, the first spring layer 109*a* is a part of the MEMS substrate 106 such that the first spring layer 109*a* comprises a same material as the MEMS substrate 106 and the moveable mass 110. In yet further embodiments, the second semiconductor material may, for example, be or comprise polysilicon, a metal (such as polycrystalline metal), another suitable material, or any combination of the foregoing.

The first semiconductor material may have a first crystal orientation, and the second semiconductor material may have a second crystal orientation different than the first crystal orientation. In some embodiments, the first and second crystal orientations of the first and second spring layers 109*a*, 109*b* may be described by Miller indices. For example, the first crystal orientation of the first spring layer 109*a* may be a single-crystal orientation that extends continuously across the first spring layer 109*a*. The single-crystal orientation of the first spring layer 109*a* may be described by Miller indices that includes a value of (1, 1, 1). In other embodiments, the single-crystal orientation of the first spring layer 109*a* may be described by Miller indices including different values such as (1, 1, 0), (0, 0, 1), (1, 0, 0), (0, 1, 0), or another suitable value. In further embodiments, the first crystal orientation may be a single-crystal orientation (e.g., (1, 1, 1)) that extends across the first spring layer 109*a*, while the second crystal orientation may comprise a plurality of different crystal orientations (e.g., (1, 1, 0), (0, 0, 1), (1, 0, 0), (0, 1, 0), and/or another suitable value) that extend across the second spring layer 109*b*. In such embodiments, the second crystal orientation may comprise a first region with a (1, 0, 0) orientation and a second region with a (1, 1, 0) orientation different than the first region. When the moveable mass 110 deflects in response to the external stimuli, the composite springs 108 are bent. This may induce stress in the composite structure 109 of the composite springs 108. In some embodiments, the induced stress may cause a crack along a surface of the first spring layer 109*a*. Due to the uniformity of the crystal lattice of the first spring layer 109*a*, the crack may, for example, propagate through the crystal lattice of the first spring layer 109*a*. However, due to the different second crystal orientation of the second spring layer 109*b*, the crack may not propagate through the second spring layer 109*b* such that the second spring layer 109*b* acts as a crack stop structure. This may prevent the composite springs 108 from breaking in response to the external stimuli. Thus, the composite springs 108 comprising the composite structure 109 may increase mechanical robustness of the composite springs 108. This increases a reliability and endurance of the MEMS structure 100.

In further embodiments, a flexural strength of a material may be defined as a stress in the material before the material breaks and/or fractures due to bending forces applied to the material. In some embodiments, the first semiconductor material (e.g., silicon, monocrystalline silicon, single-crystal silicon, etc.) of the first spring layer 109*a* has a first flexural strength and the second semiconductor material (e.g., polysilicon) of the second spring layer 109*b* has a second flexural strength different than the first flexural strength. Because the composite structure 109 comprises the first and second spring layers 109*a*, 109*b*, in some embodiments, a combined flexural strength of the composite structure 109 is greater than the first flexural strength and is greater than the second flexural strength. Thus, an endurance of the composite springs 108 is increased, thereby increasing performance of the MEMS structure 100.

Figure 2:
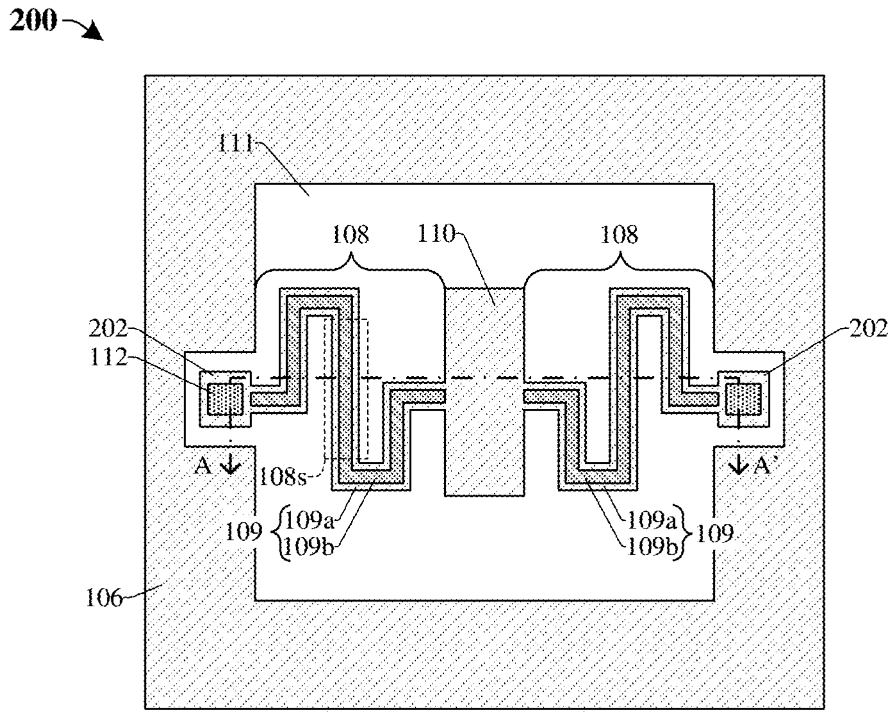
FIG. 2 illustrates some embodiments of a top view of the MEMS structure of FIG. 1 taken along the line A-A' in FIG. 1.

FIG. 2 illustrates some embodiments of a top view 200 of the MEMS structure 100 of FIG. 1 taken along the line A-A' in FIG. 1. In further embodiments, the cross-sectional view of the MEMS structure 100 of FIG. 1 may be taken along the line A-A' of the top view 200 of FIG. 2.

As illustrated in the top view 200 of FIG. 2, the moveable mass 110 is attached to peripheral regions of the MEMS substrate 106 at anchor structures 202 by way of the composite springs 108. The anchor structures 202 may be a segment of the MEMS substrate 106. The contact electrodes 112 abut the anchor structures 202 and may, for example, be electrically coupled to the moveable mass 110. The composite springs 108 comprises the composite structure 109. In some embodiments, the composite structure 109 includes the first spring layer 109*a* and the second spring layer 109*b*. The second spring layer 109*b* may, for example, be spaced laterally between two segments of the first spring layer 109*a*. Further, the first and second spring layers 109*a*, 109*b* continuously laterally extend from an anchor structure 202 to the moveable mass 110. In further embodiments, the first spring layer 109*a*, the anchor structures 202, and the moveable mass 110 comprise same material (e.g., monocrystalline silicon). Further, a segment 108*s* of the composite springs 108 is spaced laterally between the moveable mass 110 and an anchor structure 202.

FIGS. 3A-K illustrate top views 300*a-k* of some alternative embodiments of the segment 108*s* of the composite springs 108 of FIG. 2.

Figure 3A:
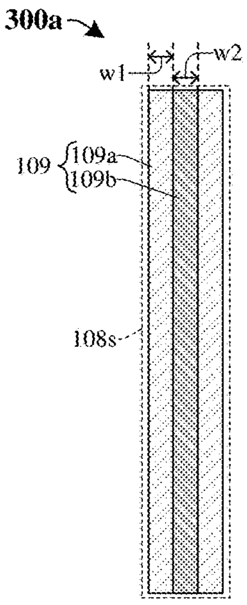
FIGS. 3A-K illustrate top views of various alternative embodiments of a segment of the composite springs of FIG. 2.

As illustrated by the top view 300*a* of FIG. 3A, the first spring layer 109*a* is disposed on opposing sides of the second spring layer 109*b*. In some embodiments, a width w1 of the first spring layer 109*a* is, for example, within a range of about 0.5 to 50 micrometers, about 0.5 to 25 micrometers, about 25 to 50 micrometers, or another suitable value. In some embodiments, a width w2 of the second spring layer 109*b* is, for example, within a range of about 0.1 to 5 micrometers, about 0.1 to 2.5 micrometers, about 2.5 to 5 micrometers, or another suitable value.

Figure 3B:
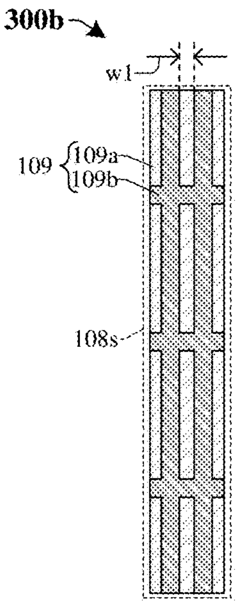

As illustrated by the top view 300*b* of FIG. 3B, the second spring layer 109*b* is configured in a grid structure comprising a plurality of elongated first segments extending in a first direction and a plurality of second segments extending in a second direction orthogonal to the first direction. The elongated first segments are parallel to one another and the second segments are parallel to one another. Further, the first spring layer 109*a* is disposed laterally between the elongated first segments and the second segments of the second spring layer 109*b*.

Figure 3C:
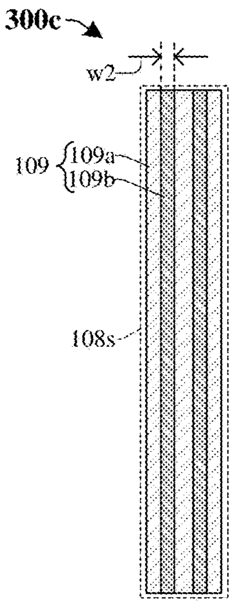

As illustrated by the top view 300*c* of FIG. 3C, the first spring layer 109*a* comprises a first plurality of elongated segments and the second spring layer 109*b* comprises a second plurality of elongated segments alternatingly spaced laterally between the first plurality of elongated segments of the first spring layer 109*a*.

Figure 3D:
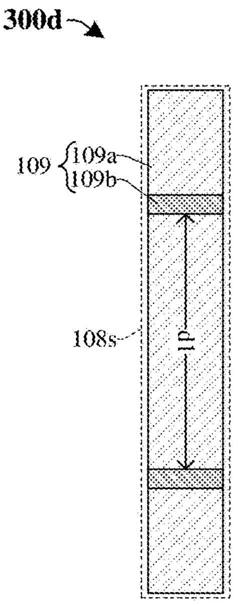

As illustrated by the top view 300*d* of FIG. 3D, the second spring layer 109*b* comprises a plurality of segments spaced laterally across a length of the first spring layer 109*a*. The segments of the second spring layer 109*b* each extend continuously across a width of the first spring layer 109*a*. In some embodiments, the segments of the second spring layer

109*b* are laterally spaced from one another by a distance d1 that may, for example, be within a range of about 0.5 to 100 micrometers, 0.5 to 50 micrometers, 50 to 100 micrometers, or another suitable value. In further embodiments, the second spring layer 109*b* comprises two or more segments.

Figure 3E:
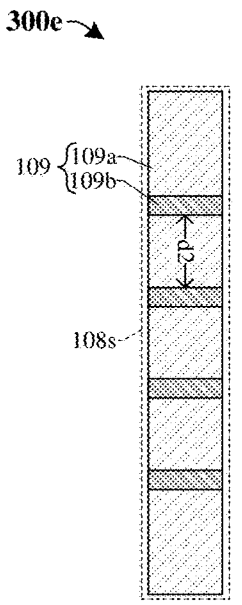

As illustrated by the top view 300*e* of FIG. 3E, the second spring layer 109*b* comprises a plurality of segments spaced laterally across a length of the first spring layer 109*a*. The segments of the second spring layer 109*b* each extend continuously across a width of the first spring layer 109*a*. In some embodiments, the segments of the second spring layer 109*b* are laterally spaced from one another by a distance d2 that may, for example, be within a range of about 0.1 to 33 micrometers, 0.1 to 16 micrometers, 16 to 33 micrometers, or another suitable value. In further embodiments, the second spring layer 109*b* comprises four or more segments.

Figure 3F:
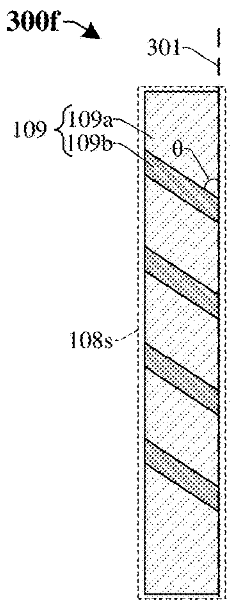
Figure 3G:
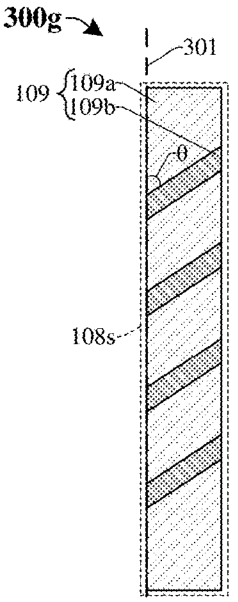

As illustrated by the top views 300*f* and 300*g* of FIGS. 3F and 3G, the second spring layer 109*b* comprises a plurality of slanted segments spaced laterally across a length of the first spring layer 109*a*. The slanted segments of the second spring layer 109*b* extend across a width of the first spring layer 109*a*. In some embodiments, an angle theta θ is defined between a substantially straight line 301 and a sidewall of each of the slanted segments of the second spring layer 109*b*. The substantially straight line 301 may be aligned with a sidewall of the first spring layer 109*a*. In further embodiments, the angle theta θ is within a range of about 1 to 89 degrees, about 1 to 45 degrees, about 45 to 89 degrees, or another suitable value.

Figure 3H:
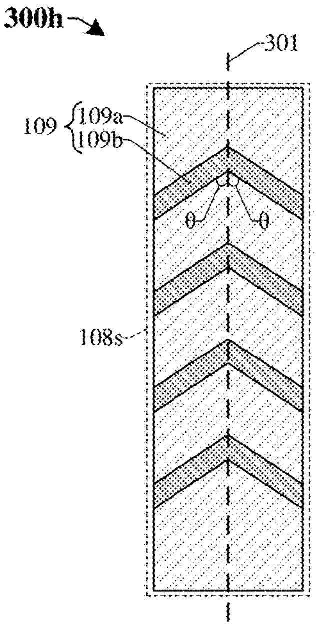

As illustrated by the top view 300*h* of FIG. 3H, the second spring layer 109*b* comprises a plurality of slanted segments spaced laterally across a length of the first spring layer 109*a*. The slanted segments each comprise a first portion disposed along a first sidewall of the first spring layer 109*a* and a second portion disposed along a second sidewall of the first spring layer 109*a*. The substantially straight line 301 is disposed along a center of a width of the first spring layer 109*a*. The first and second portions of each slanted segment of the second spring layer 109*b* are slanted from the substantially straight line 301 by the angle theta θ. In some embodiments, the angle theta θ is within a range of about 1 to 89 degrees, about 1 to 45 degrees, about 45 to 89 degrees, or another suitable value.

Figure 3I:
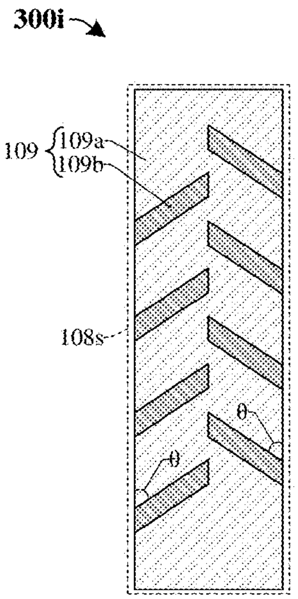
Figure 3J:
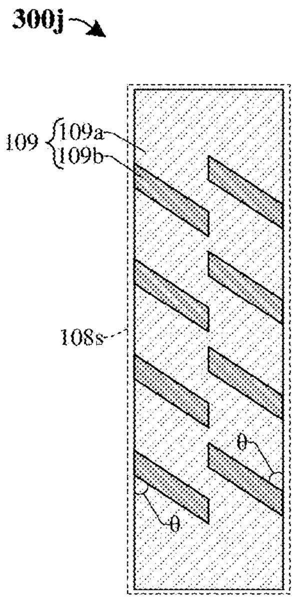

As illustrated by the top views 300*i* and 300*j* of FIGS. 3I and 3J, the second spring layer 109*b* comprises a first plurality of slanted segments and a second plurality of slanted segments. The first plurality of slanted segments are disposed along a first sidewall of the first spring layer 109*a* and the second plurality of slanted segments are disposed along a second sidewall of the first spring layer 109*a* opposite the first sidewall.

Figure 3K:
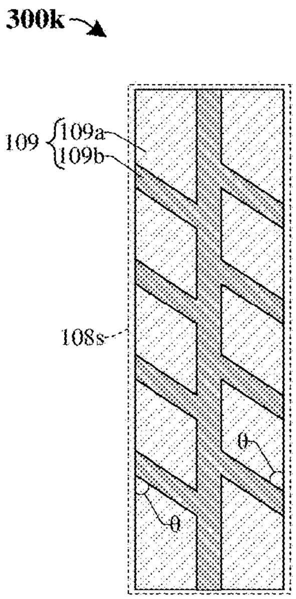

As illustrated by the top view 300*k* of FIG. 3K, the second spring layer 109*b* comprises a first plurality of slanted segments, a second plurality of slanted segments, and an elongated segment. The first plurality of slanted segments are disposed along a first sidewall of the first spring layer 109*a* and the second plurality of slanted segments are disposed along a second sidewall of the first spring layer 109*a* opposite the first sidewall. The elongated segment of the second spring layer 109*b* is disposed at a center of a width of the first spring layer 109*a* and continuously extends along a length of the first spring layer 109*a* such that the first and second plurality of slanted segments extend from the elongated segment to opposing sidewalls of the first spring layer 109*a*.

While FIGS. 3A-3K each illustrate a different variation to the segment 108*s* of the composite springs 108 of FIG. 2, it will be appreciated that the layout of the segment 108*s* illustrated in FIGS. 3A-3K may each continuously extend across an entire length and/or width of each of the composite springs 108 from a corresponding anchor structure 202 to the moveable mass 110 of FIG. 2.

Figure 4A:
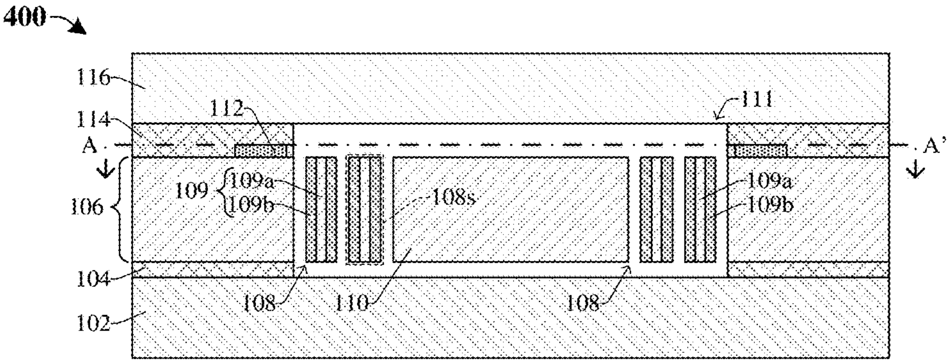
FIG. 4A illustrates a cross-sectional view of some embodiments of a MEMS structure including composite springs and a moveable mass within a cavity.
Figure 4B:
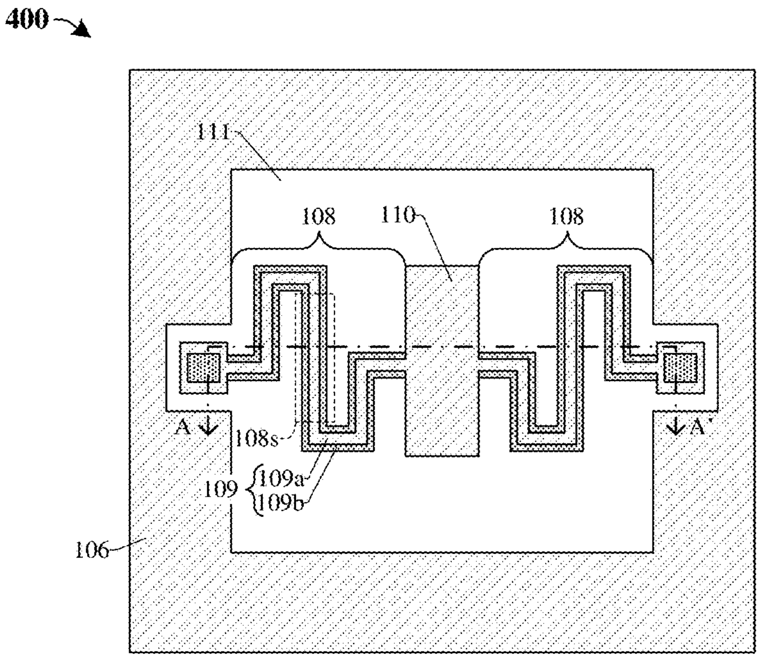
FIG. 4B illustrates some embodiments of a top view of the MEMS structure of FIG. 4A taken along the line A-A' in FIG. 4A.

FIGS. 4A and 4B illustrate various views of some embodiments of a MEMS structure 400 according to some alternative embodiments of the MEMS structure 100 of FIGS. 1 and 2. FIG. 4A illustrates some embodiments of a cross-sectional view of the MEMS structure 400 and FIG. 4B illustrates some embodiments of a top view of the MEMS structure 400. FIG. 4A illustrates a cross-sectional view of some embodiments of the MEMS structure 400 taken along the line A-A' of the top view of FIG. 4B. Further, FIG. 4B illustrates the top view of some embodiments of the MEMS structure 400 taken along the line A-A' of the cross-sectional view of FIG. 4A.

As illustrated by the FIGS. 4A and 4B, the composite structure 109 of the composite springs 108 comprises the first spring layer 109*a* and the second spring layer 109*b*. With reference to the cross-sectional view of FIG. 4A, the first spring layer 109*a* is spaced laterally between elongated segments of the second spring layer 109*b*, such that the second spring layer 109*b* is disposed on opposing sides of the first spring layer 109*a*.

FIGS. 5A-F illustrate top views 500*a-f* of some alternative embodiments of the segment 108*s* of the composite springs 108 of FIG. 4B.

Figure 5A:
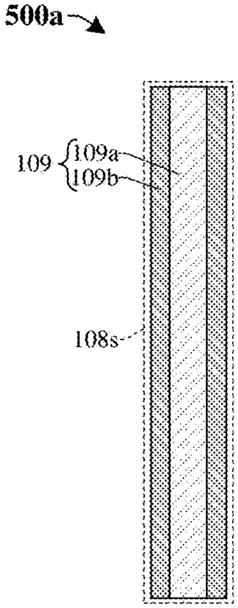
FIGS. 5A-F illustrate top views of various alternative embodiments of a segment of the composite springs of FIG. 4B.

As illustrated by the top view 500*a* of FIG. 5A, the second spring layer 109*b* is disposed on opposing sidewalls of the first spring layer 109*a*. The second spring layer 109*b* continuously laterally extends along the opposing sidewalls of the first spring layer 109*a*.

Figure 5B:
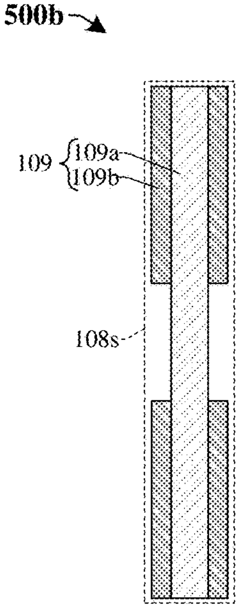

As illustrated by the top view 500*b* of FIG. 5B, the second spring layer 109*b* is disposed along opposing sidewalls of the first spring layer 109*a*. In some embodiments, the second spring layer 109*b* is laterally offset from a center region of the first spring layer 109*a* by a non-zero distance, such that the second spring layer 109*b* is discontinuous across the center region of the first spring layer 109*a*.

Figure 5C:
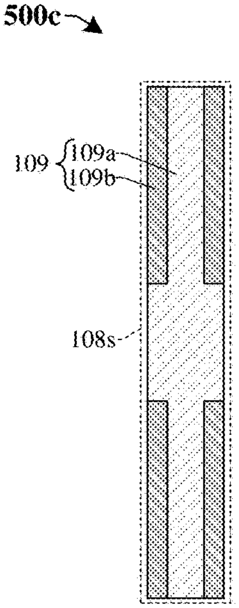

As illustrated by the top view 500*c* of FIG. 5C, the second spring layer 109*b* is disposed along opposing sidewalls of the first spring layer 109*a*, such that sidewalls of a center segment of the first spring layer 109*a* are aligned with outer sidewalls of the second spring layer 109*b*.

Figure 5D:
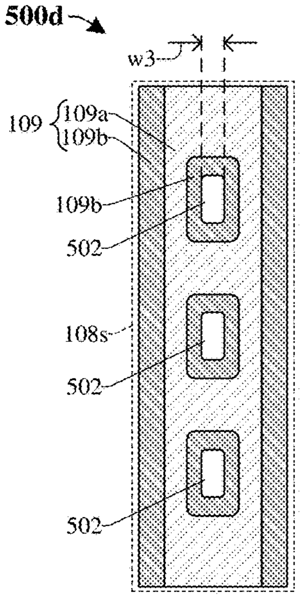

The top view 500*d* of FIG. 5D illustrates an alternative embodiment of the segment 108*s* of the composite springs 108 of FIG. 5A, in which a plurality of openings 502 are disposed within the first spring layer 109*a*. In further embodiments, a center of each of the openings 502 is aligned with a center of a width of the first spring layer 109*a*. Further, the second spring layer 109*b* laterally encloses each opening 502. In some embodiments, a width w3 of each opening 502 is, for example, within a range of about 0.5 to 100 micrometers, about 0.5 to 50 micrometers, about 50 to 100 micrometers, or another suitable value. As illustrated in FIG. 5D the openings 502 each have a square and/or rectangular shape, however, the openings 502 may have other shapes such as a circular and/or ellipse shape.

Figure 5E:
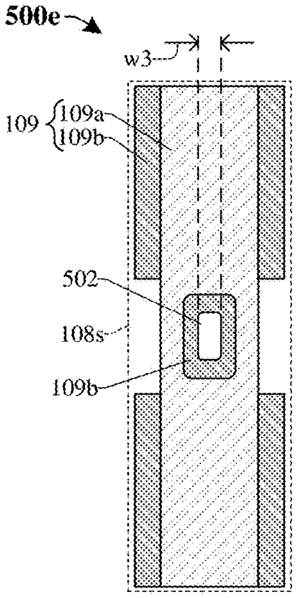

The top view 500*e* of FIG. 5E illustrates an alternative embodiment of the segment 108*s* of the composite springs 108 of FIG. 5B, in which an opening 502 is disposed within the center region of the first spring layer 109*a*. Further, the second spring layer 109*b* continuously laterally encloses the opening 502.

Figure 5F:
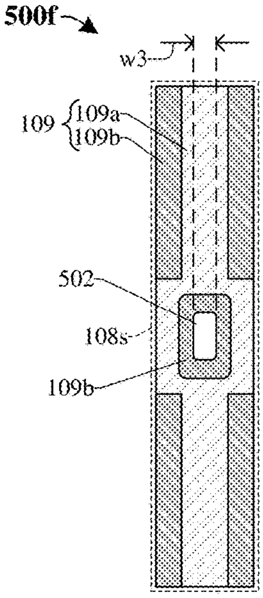

The top view 500*f* of FIG. 5F illustrates an alternative embodiment of the segment 108*s* of the composite springs 108 of FIG. 5C, in which an opening 502 is disposed within the center segment of the first spring layer 109*a*. Further, the second spring layer 109*b* continuously laterally encloses the opening 502.

While FIGS. 5A-5F each illustrate a different variation to the segment 108*s* of the composite springs 108 of FIG. 4B, it will be appreciated that the layout of the segment 108*s* illustrated in FIGS. 5A-5F may each continuously extend across an entire length and/or width of each of the composite springs 108 from a corresponding anchor structure 202 to the moveable mass 110 of FIG. 4B.

Figure 6A:
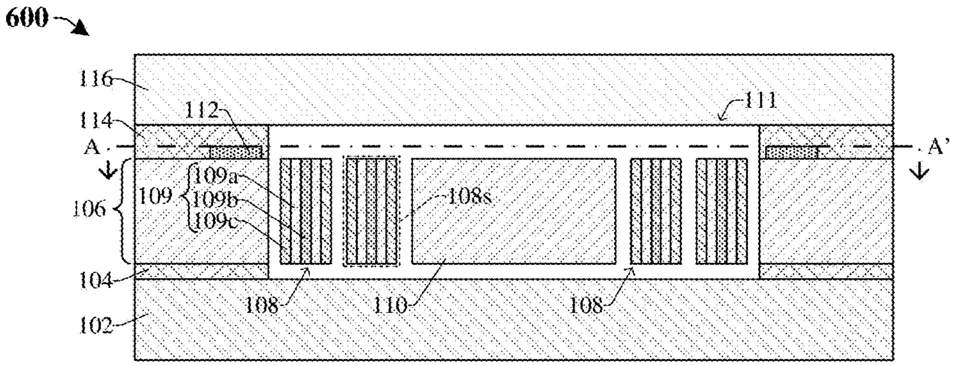
FIG. 6A illustrates a cross-sectional view of some embodiments of a MEMS structure including a composite spring structure and a moveable mass within a cavity.
Figure 6B:
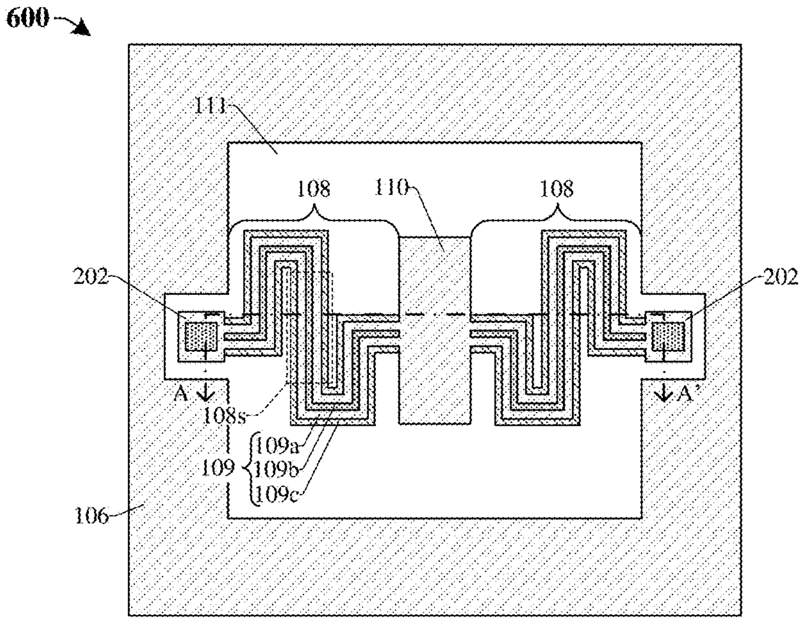
FIG. 6B illustrates some embodiments of a top view of the MEMS structure of FIG. 6A taken along the line A-A' in FIG. 6A.
Figure 7A:
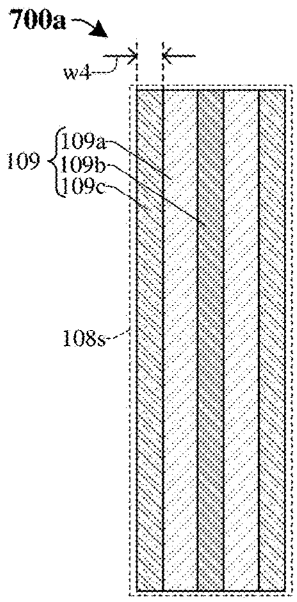
FIGS. 7A-H illustrate top views of various alternative embodiments of a segment of the composite springs of FIG. 6B.
Figure 7B:
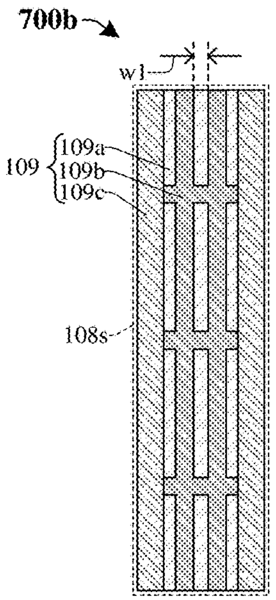
Figure 7C:
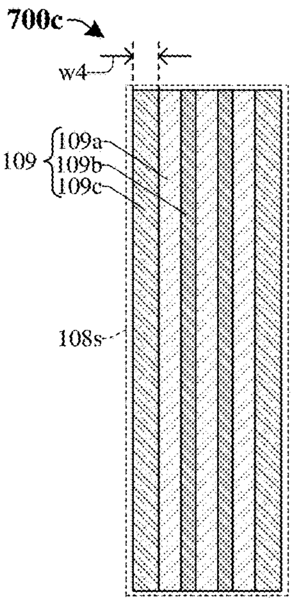
Figure 7D:
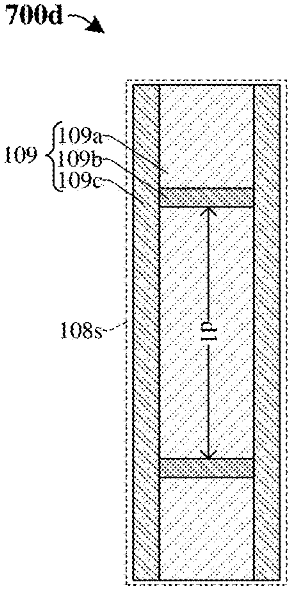
Figure 7E:
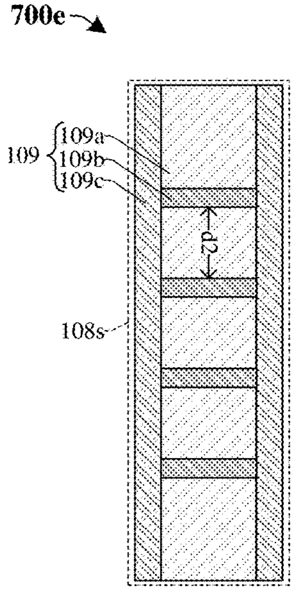
Figure 7F:
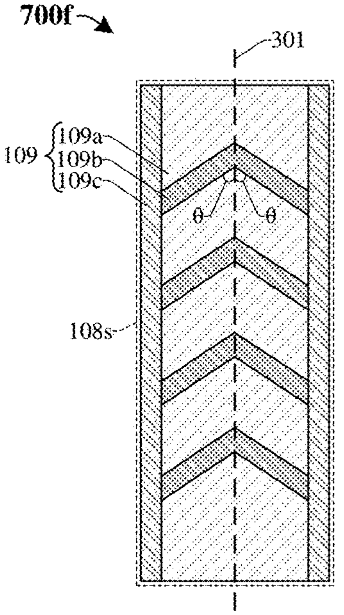
Figure 7G:
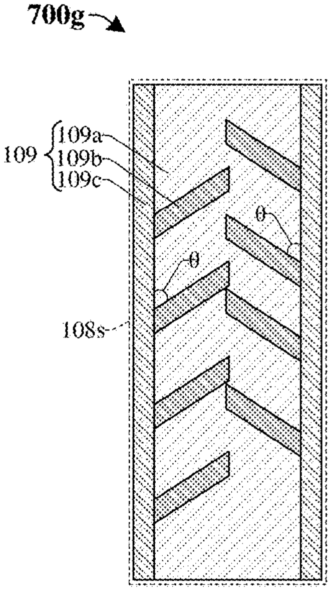
Figure 7H:
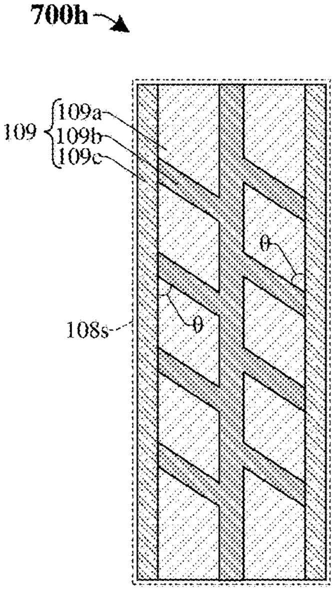

FIGS. 6A and 6B illustrate various views of some embodiments of a MEMS structure 600 according to some alternative embodiments of the MEMS structure 100 of FIGS. 1 and 2. FIG. 6A illustrates some embodiments of a cross-sectional view of the MEMS structure 600 and FIG. 6B illustrates some embodiments of a top view of the MEMS structure 600. FIG. 6A illustrates a cross-sectional view of some embodiments of the MEMS structure 600 taken along the line A-A' of the top view of FIG. 6B. Further, FIG. 6B illustrates a top view of some embodiments of the MEMS structure 600 taken along the line A-A' of the cross-sectional view of FIG. 6A.

As illustrated by the FIGS. 6A and 6B, the composite structure 109 comprises the first spring layer 109*a*, the second spring layer 109*b*, and a third spring layer 109*c*. In some embodiments, the third spring layer 109*c* is disposed along opposing sidewalls of the first spring layer 109*a*. In further embodiments, the third spring layer 109*c* continuously laterally extends from a corresponding anchor structure 202 to the moveable mass 110. In various embodiments, the third spring layer 109*c* comprises a third semiconductor material different from the first semiconductor material of the first spring layer 109*a* and the second semiconductor material of the second spring layer 109*b*. In further embodiments, the third semiconductor material may, for example, be or comprise amorphous silicon, amorphous silicon dioxide, a metal (e.g., such as an amorphous metal material), a polymer, another suitable material, or any combination of the foregoing. Thus, the third semiconductor material may have an amorphous structure that is different from the first crystal orientation of the first semiconductor material and the second crystal orientation of the second semiconductor material. For example, the amorphous structure may include a continuous random network of the atoms in the third spring layer 109*c*. Thus, in some embodiments, the third spring layer 109*c* has a non-crystalline structure. Because the amorphous structure is different from the first and second crystal orientations, a stress induced crack that forms on and/or propagates through the first and/or second spring layers 109*a*, 109*b* may not propagate through the third spring layer 109*c*. This may prevent the composite springs 108 from breaking in response to external stimuli. Thus, the composite structure 109 comprising the first, second, and third spring layers 109*a-c* may increase mechanical robustness of the composite springs 108. This increases a reliability and endurance of the MEMS structure 600.

In further embodiments, the third spring layer 109*c* comprises a third flexural strength different than the first flexural strength of the first spring layer 109*a* and different than the second flexural strength of the second spring layer 109*b*. Because the composite structure 109 comprises the first, second, and third spring layers 109*a-c*, in some embodiments, a combined flexural strength of the composite structure 109 is greater than the first flexural strength, greater than the second flexural strength, and greater than the third flexural strength. Thus, an endurance of the composite springs 108 is increased, thereby increasing performance of the MEMS structure 100. In yet further embodiments, at least one of the spring layers of the composite structure 109 may, for example, be or comprise a metal, an organic polymer, or another material with a different crystalline structure than other spring layers within the composite structure 109. In some embodiments, if the at least one of the spring layers of the composite structure 109 comprises a metal, it may be deposited by, for example, electroplating, electroless plating, or another suitable deposition or growth process. This, may result in an increased flexural strength of the composite structure 109.

FIGS. 7A-H illustrate top views 700*a-h* of some alternative embodiments of the segment 108*s* of the composite springs 108 of FIG. 6B.

The top views 700*a-h* of FIGS. 7A-H illustrate alternative embodiments of the segment 108*s* of the composite springs 108 of the top views 300*a-e*, 300*h*, 300*i*, and 300*k* of FIGS. 3A-E, 3H, 3I, and 3K, respectively, in which the third spring layer 109*c* is disposed along outer opposing sidewalls of the first spring layer 109*a*. In some embodiments, the third spring layer 109*c* has a width w4 that is, for example, within a range of about 0.1 to 2 micrometers, 0.1 to 1 micrometers, about 1 to 2 micrometers, or another suitable value.

While FIGS. 7A-H each illustrate a different variation to the segment 108*s* of the composite springs 108 of FIG. 6B, it will be appreciated that the layout of the segment 108*s* illustrated in FIGS. 7A-H may each continuously extend across an entire length and/or width of each of the composite springs 108 from a corresponding anchor structure 202 to the moveable mass 110 of FIG. 6B.

Figure 8A:
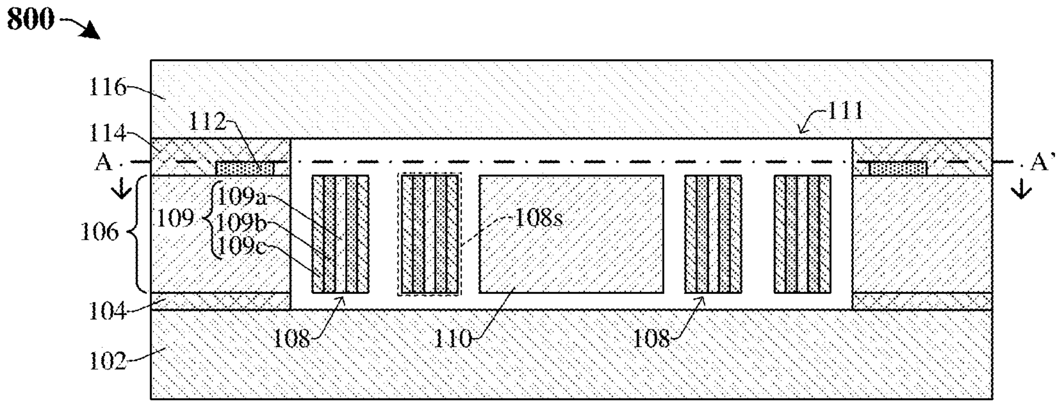
FIG. 8A illustrates a cross-sectional view of some embodiments of a MEMS structure including a composite spring structure and a moveable mass within a cavity.
Figure 8B:
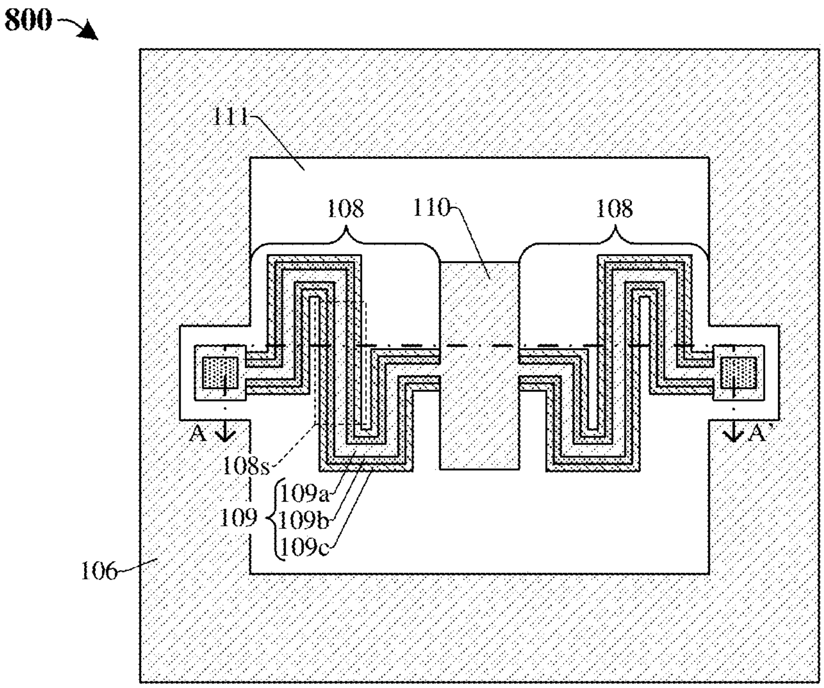
FIG. 8B illustrates some embodiments of a top view of the MEMS structure of FIG. 8A taken along the line A-A' in FIG. 8A.

FIGS. 8A and 8B illustrate various views of some embodiments of a MEMS structure 800 according to some alternative embodiments of the MEMS structure 400 of FIGS. 4A and 4B. FIG. 8A illustrates some embodiments of a cross-sectional view of the MEMS structure 800 and FIG. 8B illustrates some embodiments of a top view of the MEMS structure 800. FIG. 8A illustrates a cross-sectional view of some embodiments of the MEMS structure 800 taken along the line A-A' of the top view of FIG. 8B. Further, FIG. 8B illustrates a top view of some embodiments of the MEMS structure 800 taken along the line A-A' of the cross-sectional view of FIG. 8A.

As illustrated by the FIGS. 8A and 8B, the composite structure 109 of the composite springs 108 comprise the first spring layer 109*a*, the second spring layer 109*b*, and the third spring layer 109*c*, in which the third spring layer 109*c* is disposed along outer opposing sidewalls of the second spring layer 109*b*.

Figure 9A:
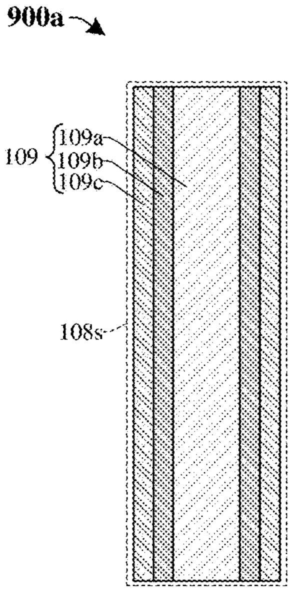
FIGS. 9A-F illustrate top views of various alternative embodiments of a segment of the composite springs of FIG. 8B.
Figure 9B:
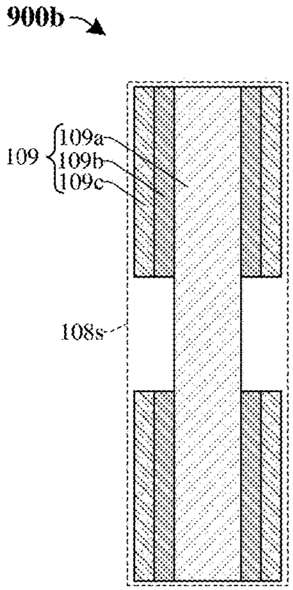
Figure 9C:
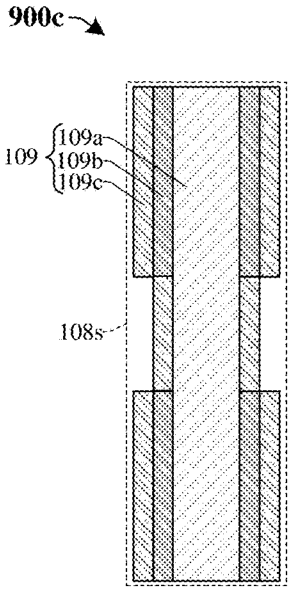
Figure 9D:
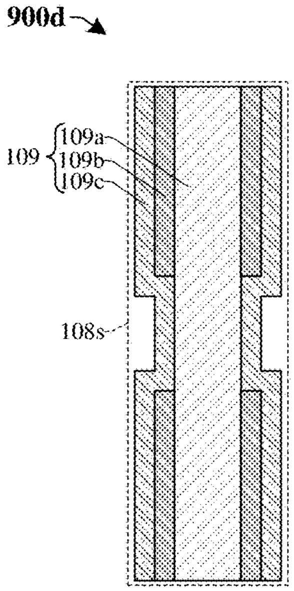
Figure 9E:
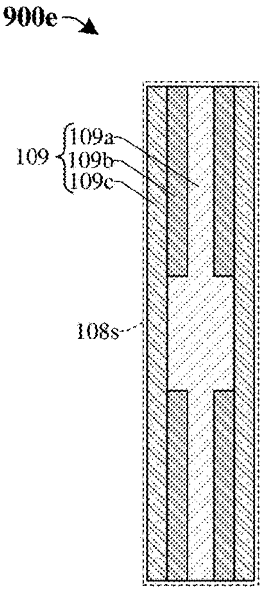
Figure 9F:
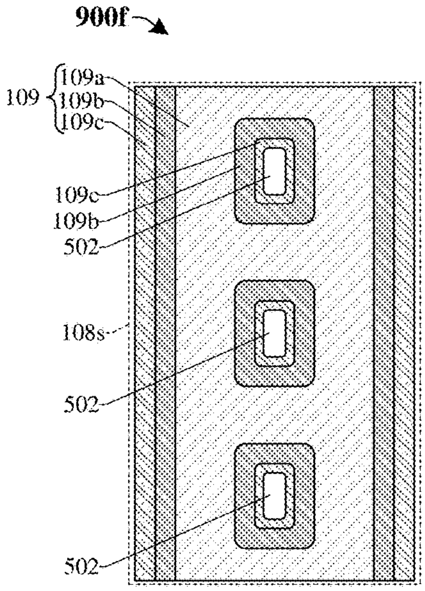

FIGS. 9A-F illustrate top views 900*a-f* of some alternative embodiments of the segment 108*s* of the composite springs 108 of FIG. 8B. For example, the top views 900*a-f* illustrate various alternative embodiments of the segment 108*s* of the composite springs 108 of the top views 500*a-f* of FIGS. 5A-F, in which the third spring layer 109*c* is disposed along outer opposing sidewalls of the second spring layer 109*b* and/or disposed along outer opposing sidewalls of the first spring layer 109*a*. In some embodiments, the top view 900*a* of FIG. 9A illustrates an alternative embodiments of the segment 108*s* of the composite springs 108 of FIG. 5A. In further embodiments, the top views 900*b-d* of the FIGS. 9B-D illustrate various alternative embodiments of the segment 108*s* of the composite springs 108 of FIG. 5B. In yet further embodiments, the top view 900*e* of FIG. 9E illustrates an alternative embodiment of the segment 108*s* of the composite springs 108 of FIG. 5C. In various embodiments, the top view 900*f* of FIG. 9F illustrates an alternative embodiment of the segment 108*s* of the composite springs 108 of FIG. 5D, in which the third spring layer 109*c* laterally encloses each of the openings 502, and the third spring layer 109*c* is disposed along outer opposing sidewalls of the second spring layer 109*b*.

While FIGS. 9A-F each illustrate a different variation to the segment 108*s* of the composite springs 108 of FIG. 8B, it will be appreciated that the layout of the segment 108*s* illustrated in FIGS. 9A-F may each continuously extend across an entire length and/or width of each of the composite springs 108 from a corresponding anchor structure 202 to the moveable mass 110 of FIG. 8B.

Figure 10A:
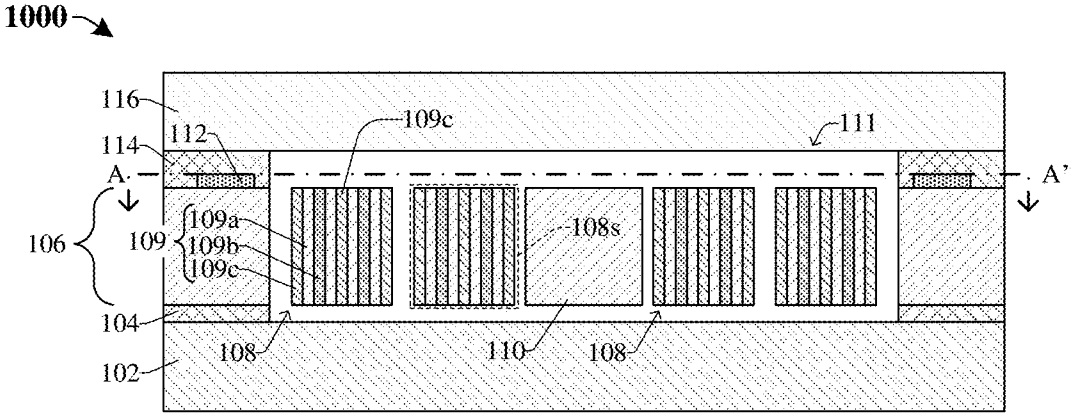
FIG. 10A illustrates a cross-sectional view of some embodiments of a MEMS structure including a composite spring structure and a moveable mass within a cavity.
Figure 10B:
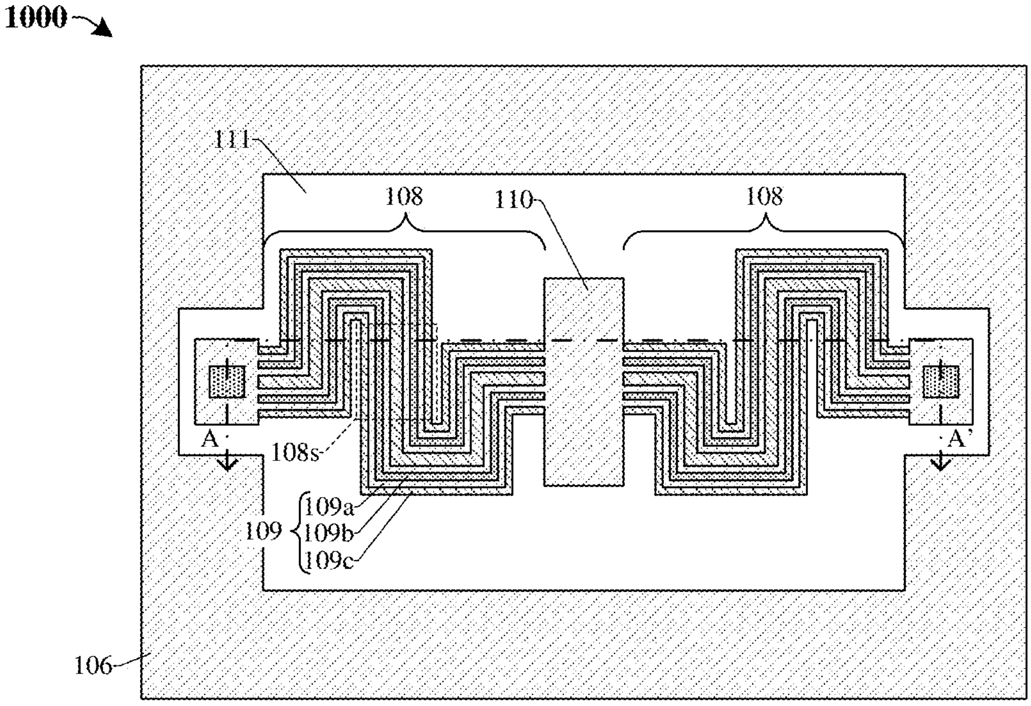
FIG. 10B illustrates some embodiments of a top view of the MEMS structure of FIG. 10A taken along the line A-A' in FIG. 10A.

FIGS. 10A and 10B illustrate various views of some embodiments of a MEMS structure 1000 according to some alternative embodiments of the MEMS structure 800 of FIGS. 8A and 8B. FIG. 10A illustrates some embodiments of a cross-sectional view of the MEMS structure 1000 and FIG. 10B illustrates some embodiments of a top view of the MEMS structure 1000. FIG. 10A illustrates a cross-sectional view of some embodiments of the MEMS structure 1000 taken along the line A-A' of FIG. 10B. Further, FIG. 10B illustrates a top view of some embodiments of the MEMS structure 1000 taken along the line A-A' of FIG. 10A.

As illustrated by the FIGS. 10A and 10B, the composite structure 109 of the composite springs 108 comprises the first spring layer 109*a*, the second spring layer 109*b*, and the third spring layer 109*c*. In some embodiments, a middle segment of the third spring layer 109*c* is disposed laterally between a first pair of segments of the first spring layer 109*a*, the first pair of segments of the first spring layer 109*a* is disposed between a pair of segments of the second spring layer 109*b*, the pair of segments of the second spring layer 109*b* is disposed between a second pair of segments of the first spring layer 109*a*, and the second pair of segments of the first spring layer 109*a* is disposed between an outer pair of segments of the third spring layer 109*c*.

FIGS. 11A-F illustrate top views 1100*a-f* of some alternative embodiments of the segment 108*s* of the composite springs 108 of FIG. 10B.

Figure 11A:
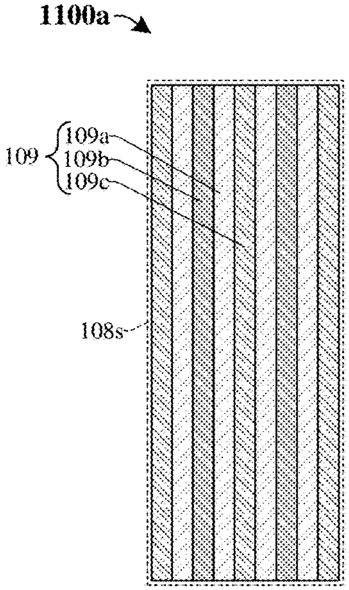
FIGS. 11A-F illustrate top views of various alternative embodiments of a segment of the composite springs of FIG. 10B.

As illustrated by the top view 1100*a* of FIG. 11A, the first spring layer 109*a*, the second spring layer 109*b*, and the third spring layer 109*c* respectively comprise a plurality of segments that are alternatingly next to one another.

Figure 11B:
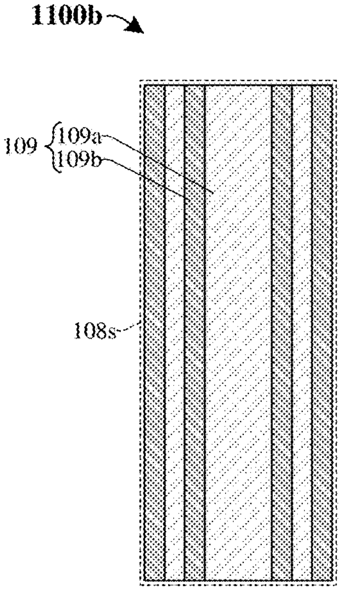

As illustrated by the top view 1100*b* of FIG. 11B, the third spring layer 109*c* is omitted. Further, the first spring layer 109*a* and the second spring layer 109*b* respectively comprise a plurality of segments that are alternatingly stacked next to one another.

Figure 11C:
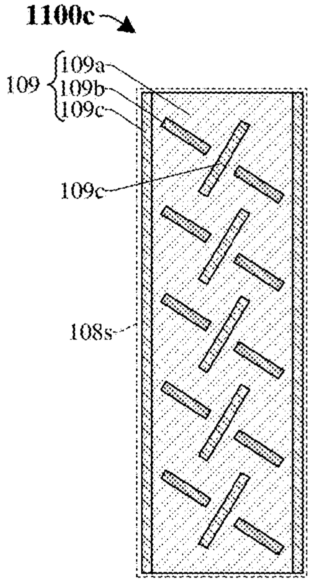

As illustrated by the top view 1100*c* of FIG. 11C, the second spring layer 109*b* and the third spring layer 109*c* each comprise a plurality of slanted segments disposed within the first spring layer 109*a*. Thus, the first spring layer 109*a* laterally encloses the slanted segments of the second spring layer 109*b* and laterally encloses the slanted segments of the third spring layer 109*c*. The plurality of slanted segments of the third spring layer 109*c* are aligned with a center of a width of the first spring layer 109*a*, and a pair of slanted segments of the second spring layer 109*b* is disposed on opposing sides of each slanted segment of the third spring layer 109*c*. Further, the third spring layer 109*c* comprises outer segments that are disposed along opposing sidewalls of the first spring layer 109*a*.

Figure 11D:
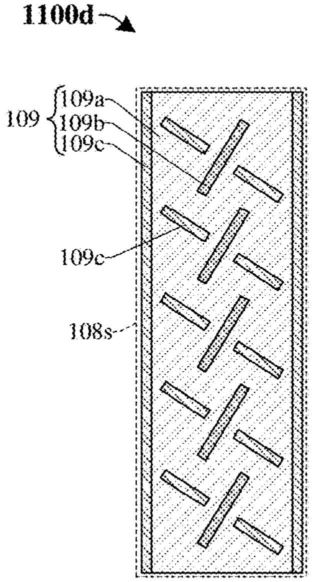

FIG. 11D illustrates a top view 1100*d* corresponding to alternative embodiments of the top view 1100*c* of FIG. 11C, in which the plurality of slanted segments of the second spring layer 109*b* are aligned with a center of a width of the first spring layer 109*a*, and a pair of slanted segments of the third spring layer 109*c* is disposed on opposing sides of each slanted segment of the third spring layer 109*c*.

Figure 11E:
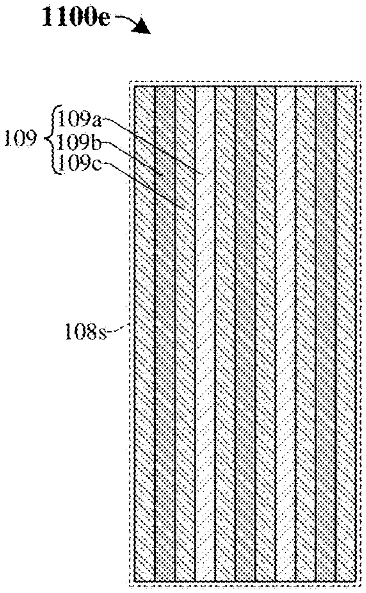

FIG. 11E illustrates a top view 1100*e* corresponding to alternative embodiments of the top view 1100*a* of FIG. 11A, in which the first spring layer 109*a*, the second spring layer 109*b*, and the third spring layer 109*c* respectively comprise a plurality of segments that are alternatingly next to one another.

Figure 11F:
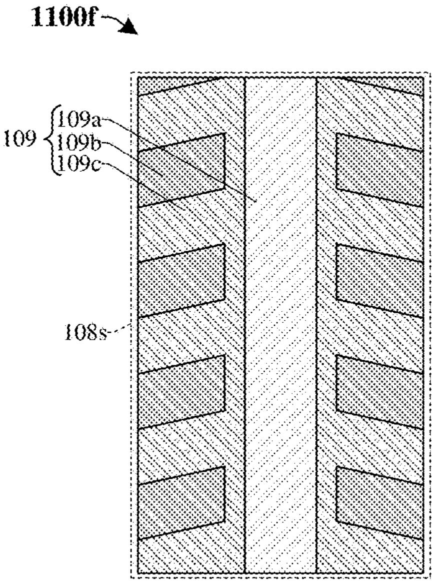

As illustrated by the top view 1100*f* of FIG. 11F, the third spring layer 109*c* continuously laterally extends along opposing sidewalls of the first spring layer 109*a* and comprises a plurality of slanted protrusions that extend from the opposing sidewalls of the first spring layer 109*a*. Further, the second spring layer 109*b* comprises a plurality of slanted segments disposed between adjacent pairs of the slanted protrusions of the third spring layer 109*c*.

While FIGS. 11A-F each illustrate a different variation to the segment 108*s* of the composite springs 108 of FIG. 10B, it will be appreciated that the layout of the segment 108*s* illustrated in FIGS. 11A-F may each continuously extend across an entire length and/or width of each of the composite springs 108 from a corresponding anchor structure 202 to the moveable mass 110 of FIG. 10B.

Figure 12:
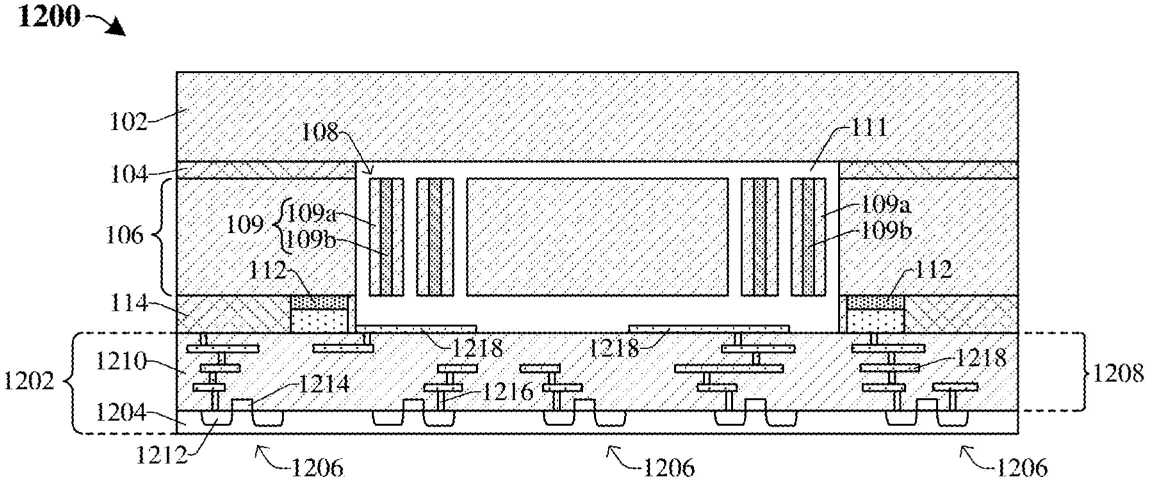
FIG. 12 illustrates a cross-sectional view of some embodiments of an integrated circuit (IC) having a MEMS structure including composite springs and a moveable mass within a cavity, where the MEMS structure overlies an application-specific integrated circuit (ASIC) substrate.

FIG. 12 illustrates a cross-section view of some embodiments of an integrated circuit (IC) 1200 having a MEMS substrate 106 disposed between a carrier substrate 102 and an application-specific integrated circuit (ASIC) structure 1202.

In some embodiments, the ASIC structure 1202 includes an interconnect structure 1208 overlying an ASIC substrate 1204. In some embodiments, the ASIC substrate 1204 may, for example, be or comprise a bulk silicon substrate, an SOI substrate, or another suitable substrate material. In further embodiments, a plurality of semiconductor devices 1206 are disposed within and/or over the ASIC substrate 1204. The semiconductor devices 1206 may be configured as transistors. Thus, in some embodiments, the semiconductor devices 1206 each comprise a gate structure 1214 overlying the ASIC substrate 1204 and source/drain regions 1212 disposed within the ASIC substrate 1204 and on opposing sides of the gate structure 1214. In further embodiments, the gate structure 1214 comprises a gate electrode overlying a gate dielectric layer.

The interconnect structure 1208 includes an interconnect dielectric structure 1210, a plurality of conductive wires 1218, and a plurality of conductive vias 1216. The conductive vias 1216 and the conductive wires 1218 are disposed within the interconnect dielectric structure 1210 and are configured to electrically couple the semiconductor devices 1206 to other devices (not shown) disposed within the IC 1200. For example, the conductive vias and wires 1216, 1218 may electrically couple the contact electrodes 112 to the semiconductor devices 1206, such that a change in capacitance due to deflection of the moveable mass 110 may be accessed at the semiconductor devices 1206. In some embodiments, the conductive vias and/or wires 1216, 1218 may, for example, respectively be or comprise copper, aluminum, titanium nitride, tantalum nitride, or any combination of the foregoing. In further embodiments, the interconnect dielectric structure 1210 may, for example, be or comprise silicon dioxide, a low-k dielectric material, an extreme low-k dielectric material, another suitable dielectric material, or any combination of the foregoing.

In some embodiments, FIG. 12 illustrates some alternative embodiments of FIG. 1, in which the capping substrate 116 is replaced with the ASIC structure 1202. It will be appreciated that the ASIC structure 1202 may replace the capping substrate 116 of the MEMS structure of FIGS. 4A, 6A, 8A, and/or 10A.

FIGS. 13-20 illustrate various views 1300-2000 of some embodiments of a first method of forming a MEMS structure including a composite spring and a moveable mass within a cavity according to the present disclosure. Although the various views 1300-2000 shown in FIGS. 13-20 are described with reference to a first method, it will be appreciated that the structures shown in FIGS. 13-20 are not limited to the first method but rather may stand alone separate of the method. Furthermore, although FIGS. 13-20 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

As shown in cross-sectional view 1300 of FIG. 13, a MEMS substrate 106 is provided and is subsequently patterned to define a plurality of openings 1302 within the MEMS substrate 106. In some embodiments, the MEMS substrate 106 may, for example, be or comprise monocrystalline silicon (i.e., single-crystal silicon), intrinsic monocrystalline silicon, a bulk silicon substrate, an SOI substrate, another suitable semiconductor material, or the like. In some embodiments, patterning the MEMS substrate 106 includes: forming a masking layer (not shown) over the MEMS substrate 106; performing an etch process according to the masking layer, thereby defining the openings 1302; and performing a removal process to remove the masking layer. In some embodiments, the etch process includes performing a dry etch process, such as a plasma etching process and/or a deep reactive-ion etching (DRIE) process.

Figure 13:
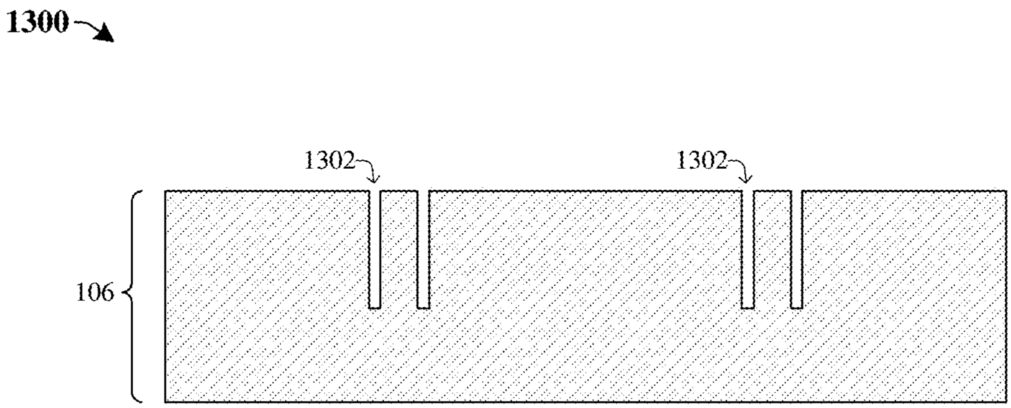
FIGS. 13-20 illustrate various views of some embodiments of a first method of forming a MEMS structure including composite springs and a moveable mass within a cavity.
Figure 14:
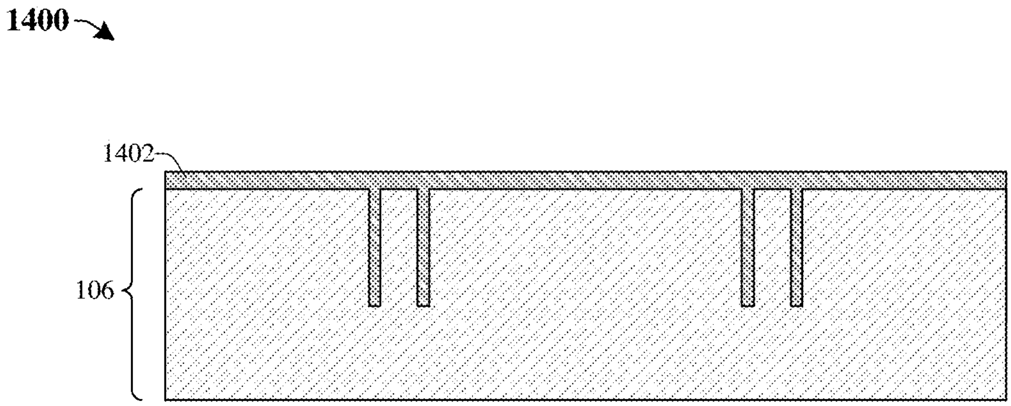

As shown in cross-sectional view 1400 of FIG. 14, a polysilicon layer 1402 is formed over the MEMS substrate 106, thereby filling the openings (1302 of FIG. 13). In some embodiments, the polysilicon layer 1402 may, for example, be or comprise polysilicon, intrinsic polysilicon, doped polysilicon, another material, or the like. In further embodiments, the polysilicon layer 1402 comprises a material different than the MEMS substrate 106. In yet further embodiments, the polysilicon layer 1402 may be deposited by, for example, a chemical vapor deposition (CVD) process, a physical vapor deposition (PVD) process, an atomic layer deposition (ALD) process, or another suitable growth or deposition process.

Figure 15:
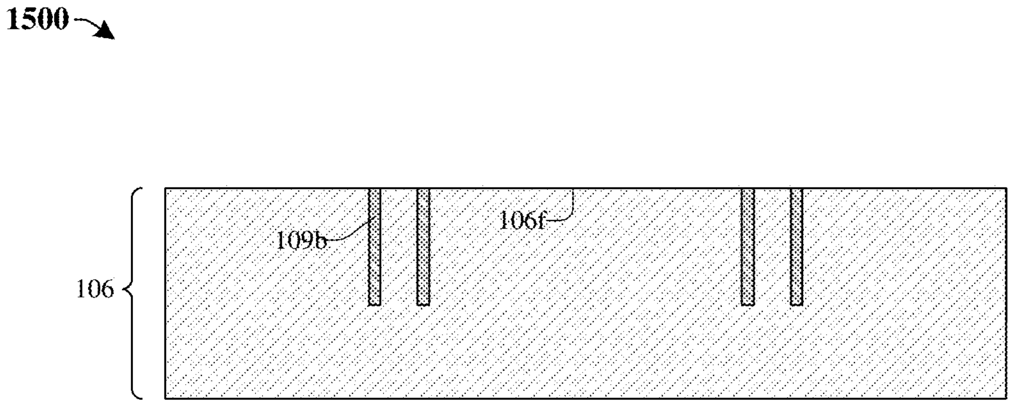

As shown in cross-sectional view 1500 of FIG. 15, a planarization process (e.g., a chemical mechanical planarization process (CMP)) is performed into the polysilicon layer (1402 of FIG. 14) until a front-side 106*f* of the MEMS substrate 106 is reached, thereby forming a second spring layer 109*b* in the MEMS substrate 106.

Figure 16:
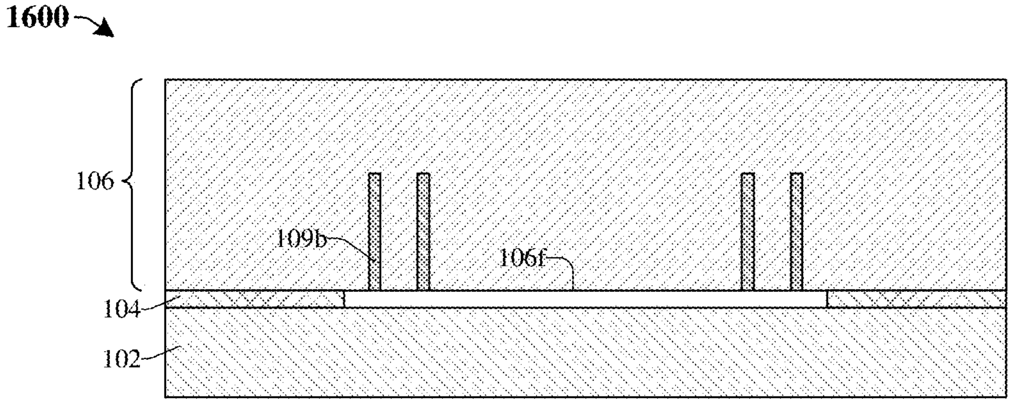

As shown in cross-sectional view 1600 of FIG. 16, a carrier substrate 102 and a lower bonding structure 104 are provided. Subsequently, the front-side 106*f* of the MEMS substrate 106 is bonded to the lower bonding structure 104. In some embodiments, the bonding process may, for example, be a fusion bonding process, a hybrid bonding process, or another suitable bonding process. In some embodiments, the carrier substrate 102 may, for example, be or comprise a bulk substrate (e.g., a bulk silicon substrate), a monocrystalline silicon substrate, a silicon-on-insulator (SOI) substrate, or some other suitable substrate. In further embodiments, the lower bonding structure 104 may, for example, be or comprise an oxide, such as silicon dioxide, or another suitable material.

Figure 17:
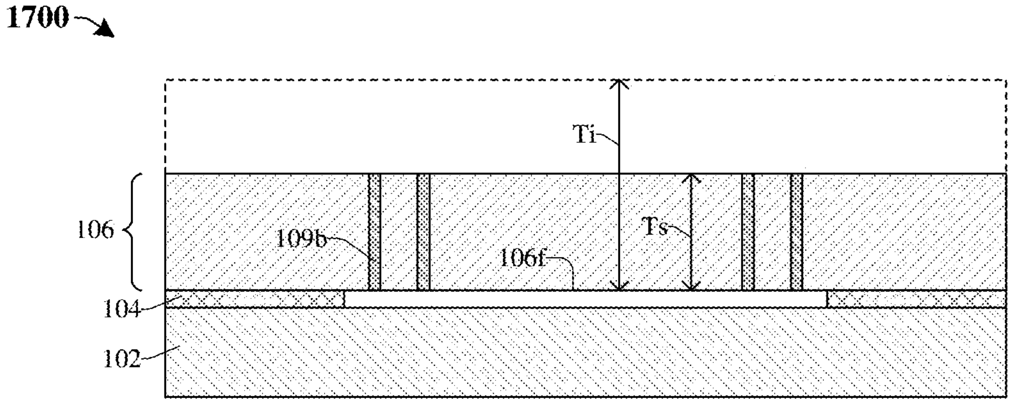

As shown in cross-sectional view 1700 of FIG. 17, a thinning process is performed on the MEMS substrate 106 to reduce an initial thickness Ti of the MEMS substrate 106 to a thickness Ts. In some embodiments, the thinning process is performed by a mechanical grinding process, a CMP process, some other thinning process, or any combination of the foregoing. For example, the thinning process may be performed wholly by a mechanical grinding process.

Figure 18:
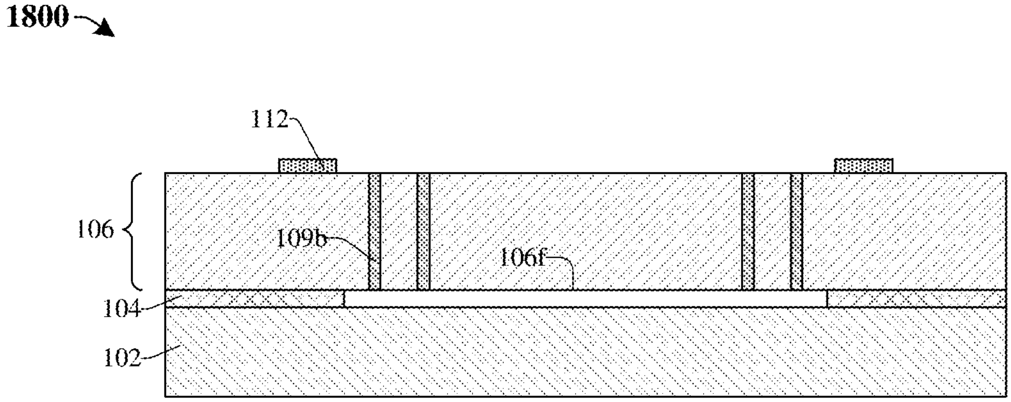

As shown in cross-sectional view 1800 of FIG. 18, contact electrodes 112 are formed over the MEMS substrate 106. In some embodiments, a process for forming the contact electrodes 112 may include: depositing (e.g., by CVD, PVD, sputtering, electroplating, electroless plating, etc.) a conductive layer over the MEMS substrate 106; forming a masking layer (not shown) over the conductive layer; patterning the conductive layer according to the masking layer, thereby defining the contact electrodes 112; and performing a removal process to remove the masking layer. In some embodiments, the contact electrodes 112 may, for example, be or comprise aluminum, copper, titanium, another suitable conductive material, or any combination of the foregoing.

Figure 19A:
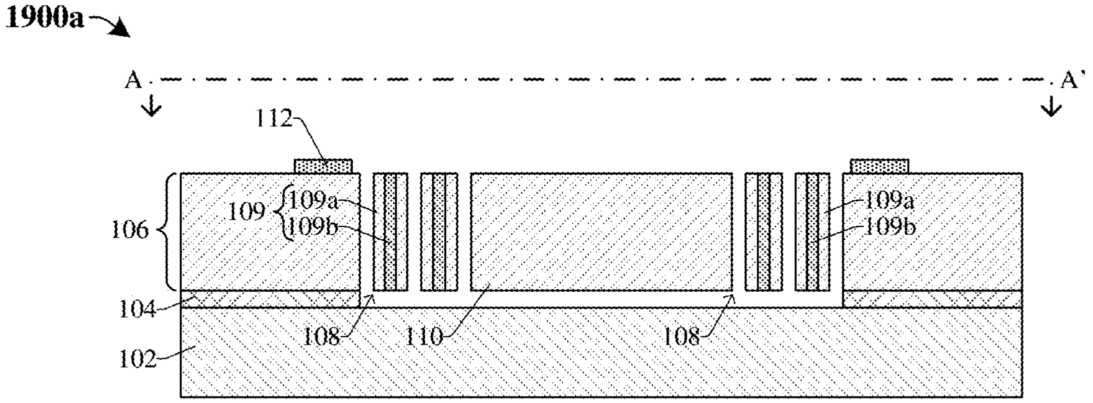
Figure 19B:
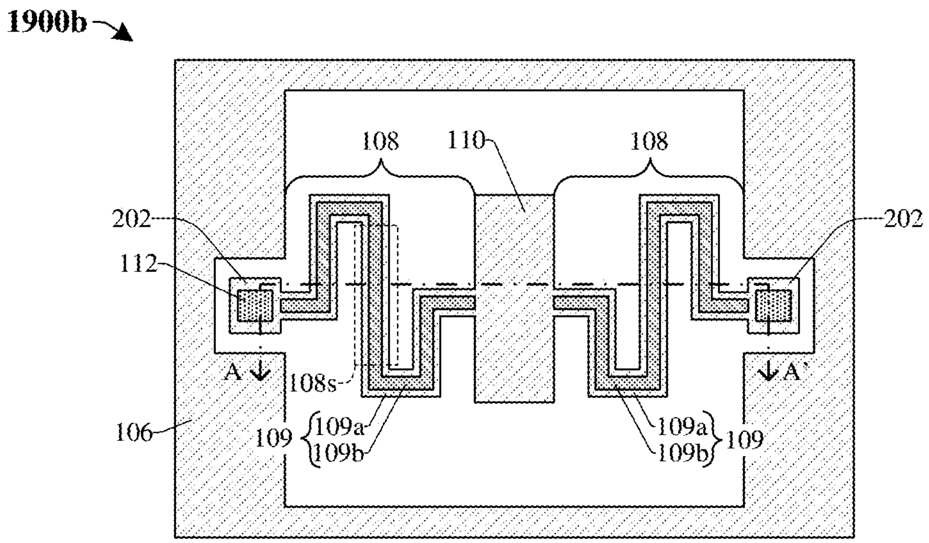

As shown in the cross-sectional view 1900*a* of FIG. 19A and the top view 1900*b* of FIG. 19B, the MEMS substrate 106 is patterned, thereby defining the moveable mass 110, the composite springs 108, and the first spring layer 109*a* of the composite structure 109. In some embodiments, patterning the MEMS substrate 106 includes: forming a masking layer (not shown) over the MEMS substrate 106 and the contact electrodes 112; performing an etch process according to the masking layer, thereby defining the moveable mass 110, the composite springs 108, and the first spring layer 109*a*; and performing a removal process to remove the masking layer. In some embodiments, the etch process includes performing a dry etch process, such as a plasma etching process and/or a DRIE process.

FIG. 19B illustrates the top view 1900*b* corresponding to some embodiments of the cross-sectional view 1900*a* of FIG. 19A taken along the line A-A' of FIG. 19A. FIG. 19B illustrates the layout of the composite springs 108 extending from a corresponding anchor structure 202 to the moveable mass 110. In further embodiments, the patterning process of the cross-sectional view 1900*a* of FIG. 19A may further define the anchor structures 202. In yet further embodiments, the first spring layer 109*a* and the second spring layer 109*b* may each be formed and/or defined such that a top view layout of the composite structure 109 corresponds to any of the top views 300*a-k* of FIGS. 3A-K.

Figure 20:
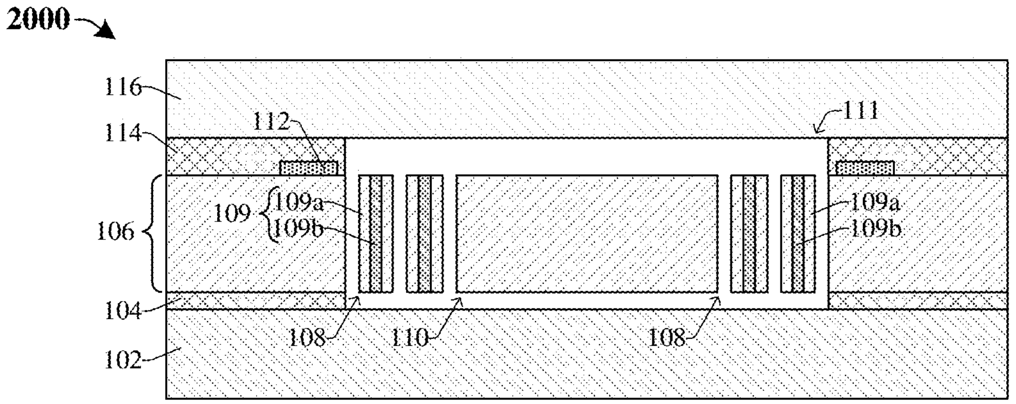

As shown in cross-sectional view 2000 of FIG. 20, a capping substrate 116 and an upper bonding structure 114 are provided. Subsequently, the capping substrate 116 is bonded to the MEMS substrate 106 by way of the upper bonding structure 114. In some embodiments, the bonding process may, for example, be a fusion bonding process, a hybrid bonding process, or another suitable bonding process. In further embodiments, the capping substrate 116 may, for example, be or comprise a bulk semiconductor substrate, such as a bulk silicon substrate, or a silicon-on-insulator (SOI) substrate, or another suitable substrate material. In yet further embodiments, the upper bonding structure 114 may, for example, be or comprise an oxide, such as silicon dioxide, or another suitable dielectric material. In some embodiments, after forming the capping substrate 116, the contact electrodes 112 may be electrically coupled to another integrated chip (not shown) by one or more bonding structures (not shown), one or more TSVs (not shown) extending through the capping substrate 116 to contact the contact electrodes 112, or another suitable method and/or structure may be used to couple the contact electrodes 112 to another integrated chip (not shown).

FIGS. 21-28 illustrate various views 2100-2800 of some embodiments of a second method of forming a MEMS structure including a composite spring and a moveable mass within a cavity according to the present disclosure. Although the various views 2100-2800 shown in FIGS. 21-28 are described with reference to a second method, it will be appreciated that the structures shown in FIGS. 21-28 are not limited to the second method but rather may stand alone separate of the method. Furthermore, although FIGS. 21-28 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

As shown in cross-sectional view 2100 of FIG. 21, a MEMS substrate 106 is provided and is subsequently patterned to define a plurality of openings 2102 within the MEMS substrate 106. In some embodiments, the MEMS substrate 106 may, for example, be or comprise monocrystalline silicon (i.e., single-crystal silicon), intrinsic monocrystalline silicon, a bulk silicon substrate, an SOI substrate, another suitable semiconductor material, or the like. In some embodiments, patterning the MEMS substrate 106 includes: forming a masking layer (not shown) over the MEMS substrate 106; performing an etch process according to the masking layer, thereby defining the openings 2102; and performing a removal process to remove the masking layer. In some embodiments, the etch process includes performing a dry etch process, such as a plasma etching process and/or a DRIE process.

Figure 21:
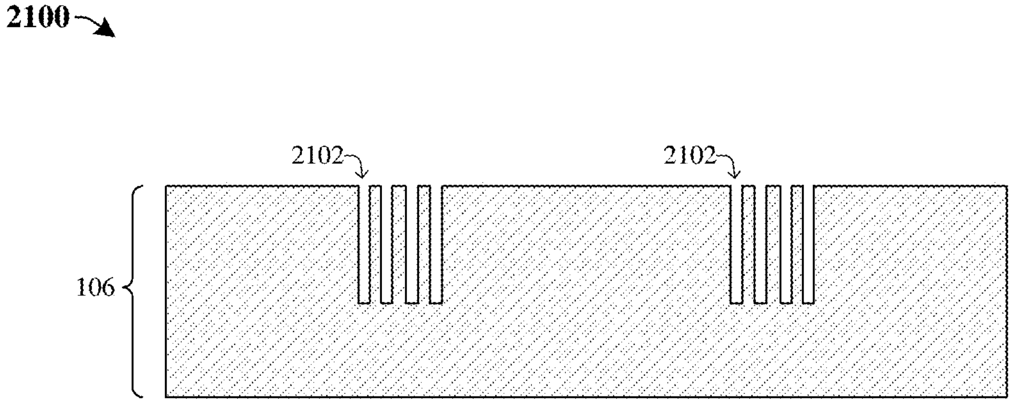
FIGS. 21-28 illustrate various views of some embodiments of a second method of forming a MEMS structure including composite springs and a moveable mass within a cavity.
Figure 22:
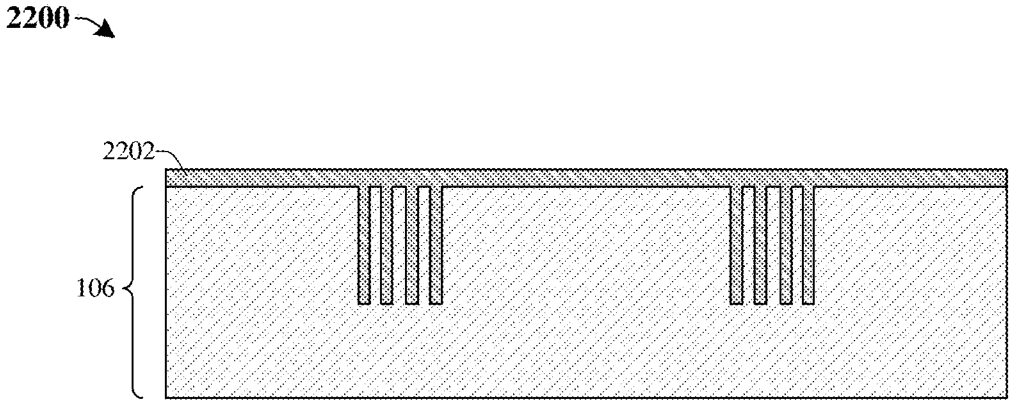

As shown in cross-sectional view 2200 of FIG. 22, a polysilicon layer 2202 is formed over the MEMS substrate 106, thereby filling the openings (2102 of FIG. 21). In some embodiments, the polysilicon layer 2202 may, for example, be or comprise polysilicon, intrinsic polysilicon, doped polysilicon, another suitable material, or the like. In further embodiments, the polysilicon layer 2202 comprises a material different than the MEMS substrate 106. In yet further embodiments, the polysilicon layer 2202 may be deposited by, for example, a CVD process, a PVD process, an ALD process, or another suitable growth or deposition process.

Figure 23:
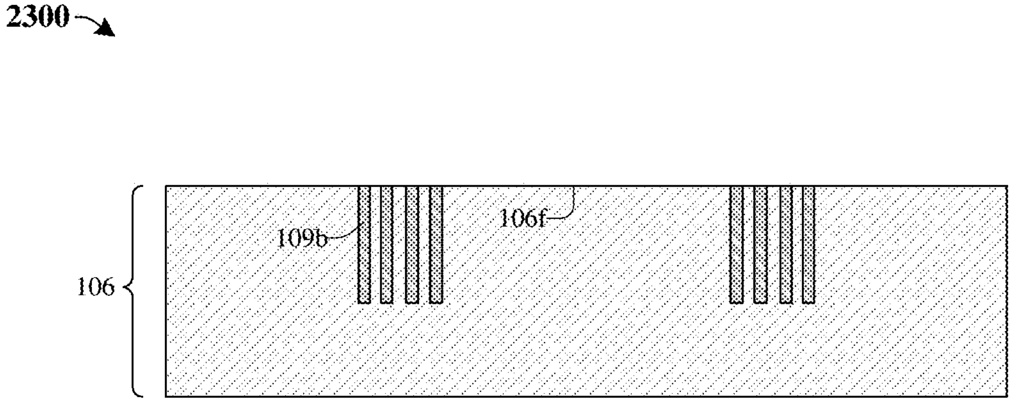

As shown in cross-sectional view 2300 of FIG. 23, a planarization process (e.g., a CMP process) is performed into the polysilicon layer (2202 of FIG. 22) until a front-side **106*f* of the MEMS substrate 106 is reached, thereby forming a second spring layer 109*b* in the MEMS substrate 106**.

Figure 24:
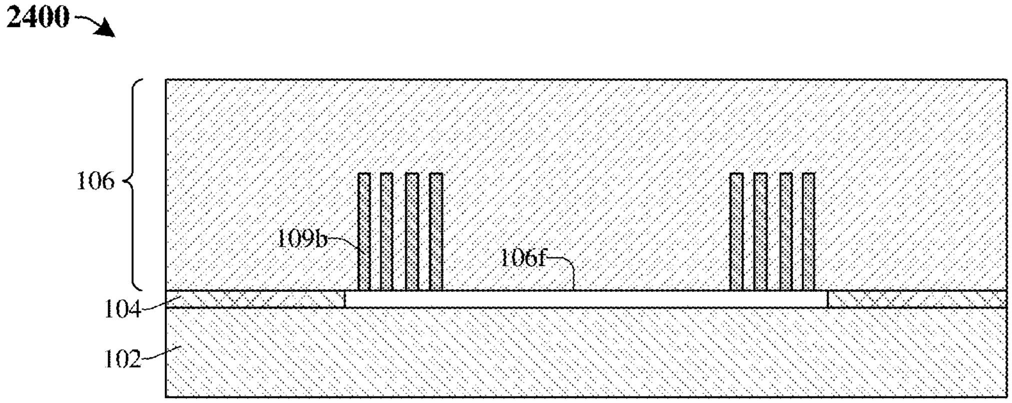

As shown in cross-sectional view 2400 of FIG. 24, a carrier substrate 102 and a lower bonding structure 104 are provided. Subsequently, the front-side **106*f* of the MEMS substrate 106 is bonded to the lower bonding structure 104. In some embodiments, the bonding process may, for example, be a fusion bonding process, a hybrid bonding process, or another suitable bonding process. In some embodiments, the carrier substrate 102 may, for example, be or comprise a bulk substrate (e.g., a bulk silicon substrate), a monocrystalline silicon substrate, an SOI substrate, or some other suitable substrate. In further embodiments, the lower bonding structure 104** may, for example, be or comprise an oxide, such as silicon dioxide, or another suitable material.

Figure 25:
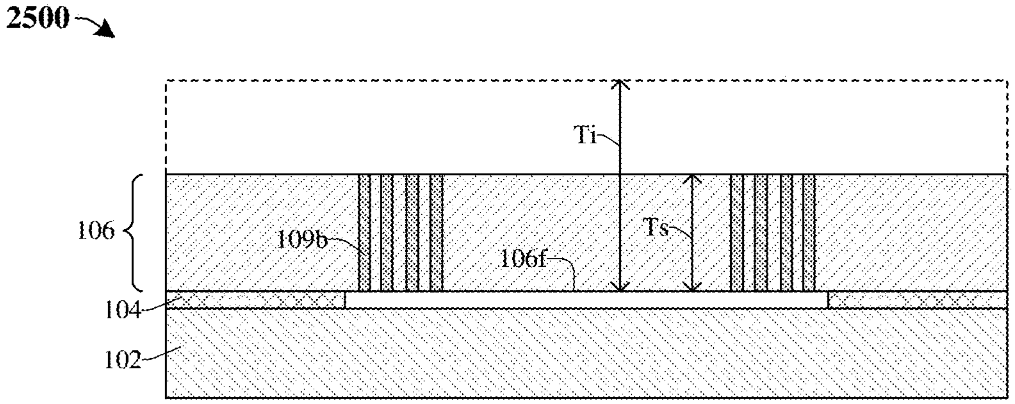

As shown in cross-sectional view 2500 of FIG. 25, a thinning process is performed on the MEMS substrate 106 to reduce an initial thickness Ti of the MEMS substrate 106 to a thickness Ts. In some embodiments, the thinning process is performed by a mechanical grinding process, a CMP process, some other thinning process, or any combination of the foregoing. For example, the thinning process may be performed wholly by a mechanical grinding process.

Figure 26:
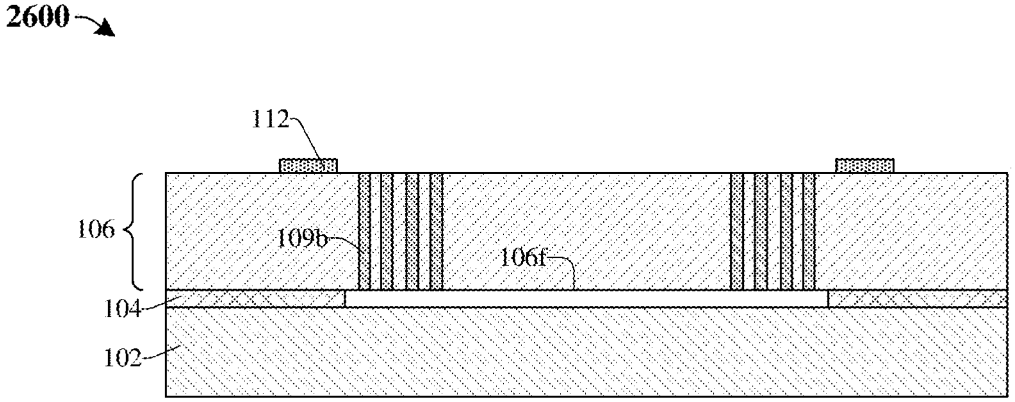

As shown in cross-sectional view 2600 of FIG. 26, contact electrodes 112 are formed over the MEMS substrate 106. In some embodiments, a process for forming the contact electrodes 112 may include: depositing (e.g., by CVD, PVD, sputtering, electroplating, electroless plating, etc.) a conductive layer over the MEMS substrate 106; forming a masking layer (not shown) over the conductive layer; patterning the conductive layer according to the masking layer, thereby defining the contact electrodes 112; and performing a removal process to remove the masking layer. In some embodiments, the contact electrodes 112 may, for example, be or comprise aluminum, copper, titanium, another suitable conductive material, or any combination of the foregoing.

Figure 27A:
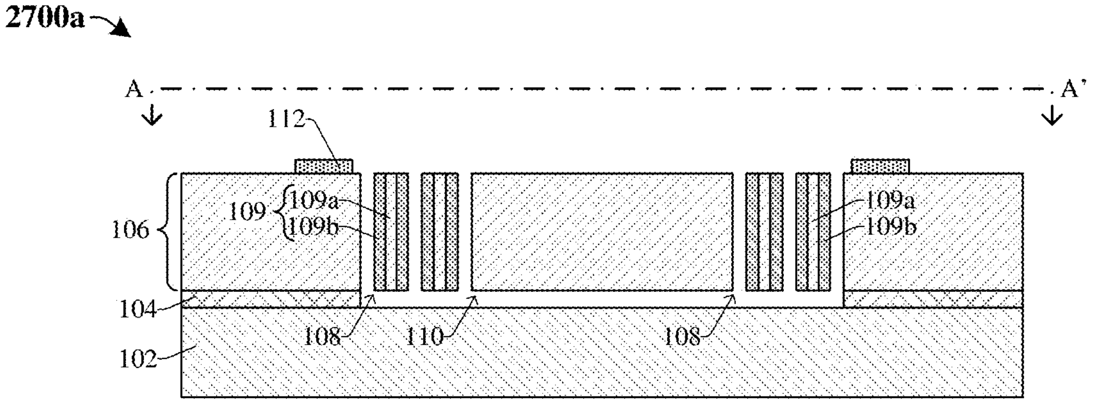
Figure 27B:
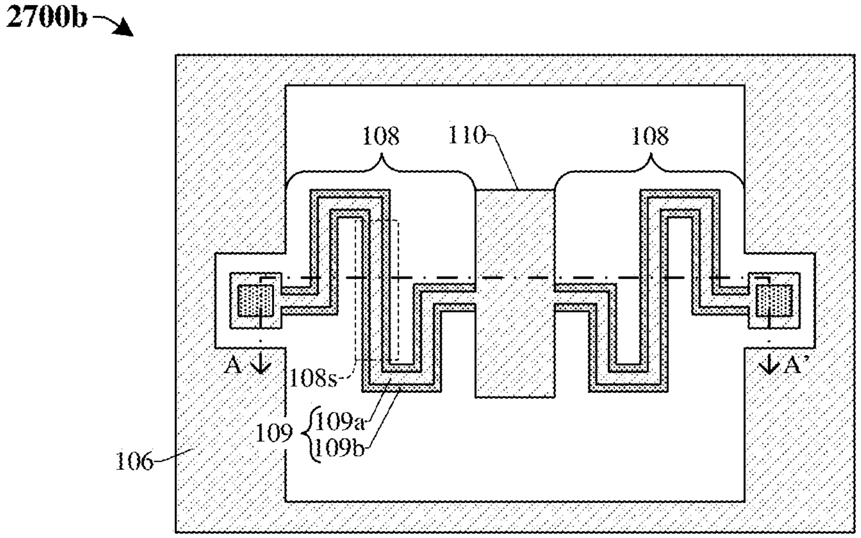

As shown in the cross-sectional view **2700*a* of FIG. 27A and the top view 2700*b* of FIG. 27B, the MEMS substrate 106 is patterned, thereby defining the moveable mass 110, the composite springs 108, and the first spring layer 109*a* of the composite structure 109. In some embodiments, patterning the MEMS substrate 106 includes: forming a masking layer (not shown) over the MEMS substrate 106 and the contact electrodes 112; performing an etch process according to the masking layer, thereby defining the moveable mass 110, the composite springs 108, and the first spring layer 109*a***; and performing a removal process to remove the masking layer. In some embodiments, the etch process includes performing a dry etch process, such as a plasma etching process and/or a DRIE process.

FIG. 27B illustrates the top view **2700*b* corresponding to some embodiments of the cross-sectional view 2700*a* of FIG. 27A taken along the line A-A' of FIG. 27A. FIG. 27B illustrates the layout of the composite springs 108 extending from a corresponding anchor structure 202 to the moveable mass 110. In further embodiments, the patterning process of the cross-sectional view 2700*a* of FIG. 27A may further define the anchor structures 202. In further embodiments, the first spring layer 109*a* and the second spring layer 109*b* may each be formed and/or defined such that a top view layout of the composite structure 109 corresponds to any of the top views 500*a-f* of FIGS. 5**A-F.

Figure 28:
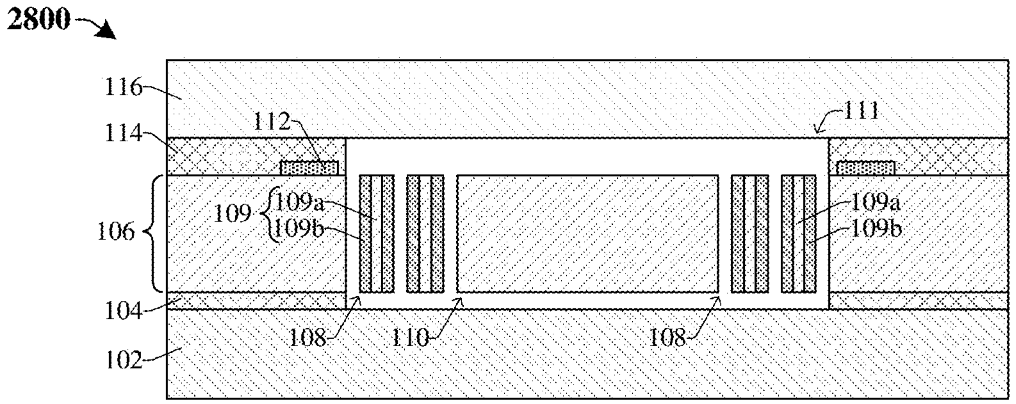

As shown in cross-sectional view 2800 of FIG. 28, a capping substrate 116 and an upper bonding structure 114 are provided. Subsequently, the capping substrate 116 is bonded to the MEMS substrate 106 by way of the upper bonding structure 114. In some embodiments, the bonding process may, for example, be a fusion bonding process, a hybrid bonding process, or another suitable bonding process. In further embodiments, the capping substrate 116 may, for example, be or comprise a bulk semiconductor substrate, such as a bulk silicon substrate, a silicon-on-insulator (SOI) substrate, or another suitable substrate material. In yet further embodiments, the upper bonding structure 114 may, for example, be or comprise an oxide, such as silicon dioxide, or another suitable dielectric material.

FIGS. 29-39 illustrate various views 2900-3900 of some embodiments of a third method of forming a MEMS structure including a composite spring and a moveable mass within a cavity according to the present disclosure. Although the various views 2900-3900 shown in FIGS. 29-39 are described with reference to a third method, it will be appreciated that the structures shown in FIGS. 29-39 are not limited to the third method but rather may stand alone separate of the method. Furthermore, although FIGS. 29-39 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

As shown in cross-sectional view 2900 of FIG. 29, a MEMS substrate 106 is provided and is subsequently patterned to define a plurality of openings 2902 within the MEMS substrate 106. In some embodiments, the MEMS substrate 106 may, for example, be or comprise monocrystalline silicon (i.e., single-crystal silicon), intrinsic monocrystalline silicon, a bulk silicon substrate, an SOI substrate, another suitable semiconductor material, or the like. In some embodiments, patterning the MEMS substrate 106 includes: forming a masking layer (not shown) over the MEMS substrate 106; performing an etch process according to the masking layer, thereby defining the openings 2902; and performing a removal process to remove the masking layer. In some embodiments, the etch process includes performing a dry etch process, such as a plasma etching process and/or a DRIE process.

In addition, each opening 2902 may be formed such that it has a height h1. In some embodiments, the height h1 may, for example, be within a range of about 25 to 200 micrometers, within a range of about 5 to 500 micrometers, within a range of about 0.5 to 100 micrometers, within a range of about 0.5 to 50 micrometers, within a range of about 50 to 100 micrometers, or less than about 5 micrometers. It will be appreciated that other values for the height h1 are also within the scope of the disclosure.

Figure 29:
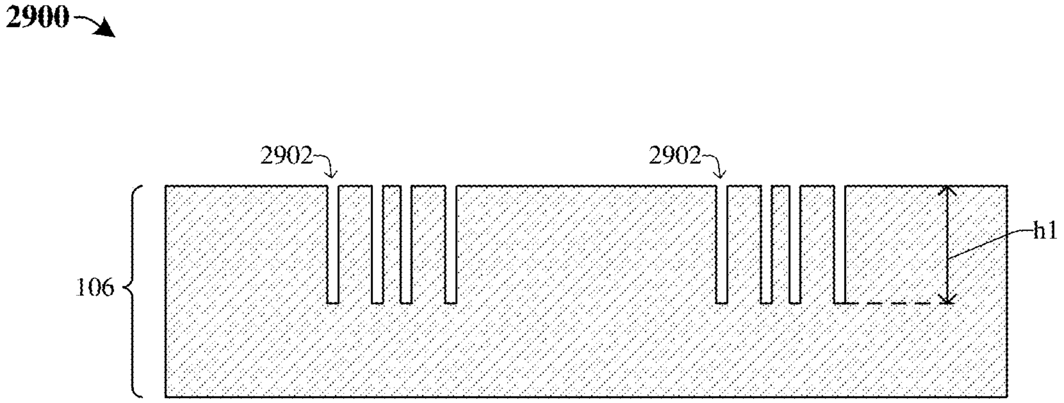
FIGS. 29-39 illustrate various views of some embodiments of a third method of forming a MEMS structure including composite springs and a moveable mass within a cavity.
Figure 30:
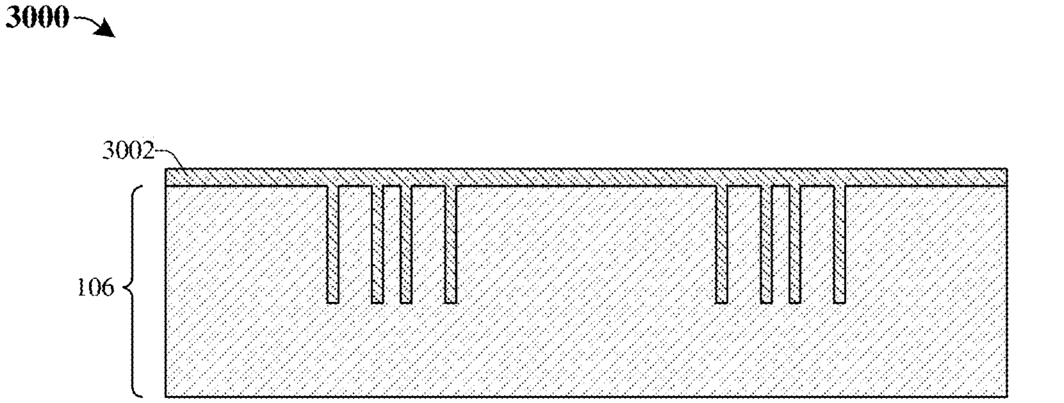

As shown in cross-sectional view 3000 of FIG. 30, a dielectric layer 3002 is formed over the MEMS substrate 106, thereby filling the openings (2902 of FIG. 29). In some embodiments, the dielectric layer 3002 may, for example, be or comprise amorphous silicon, amorphous silicon dioxide, or the like. In further embodiments, the dielectric layer 3002 comprises a material different than the MEMS substrate 106. In yet further embodiments, the dielectric layer 3002 may be deposited by, for example, a CVD process, a PVD process, thermal oxidation, or another suitable growth or deposition process.

Figure 31:
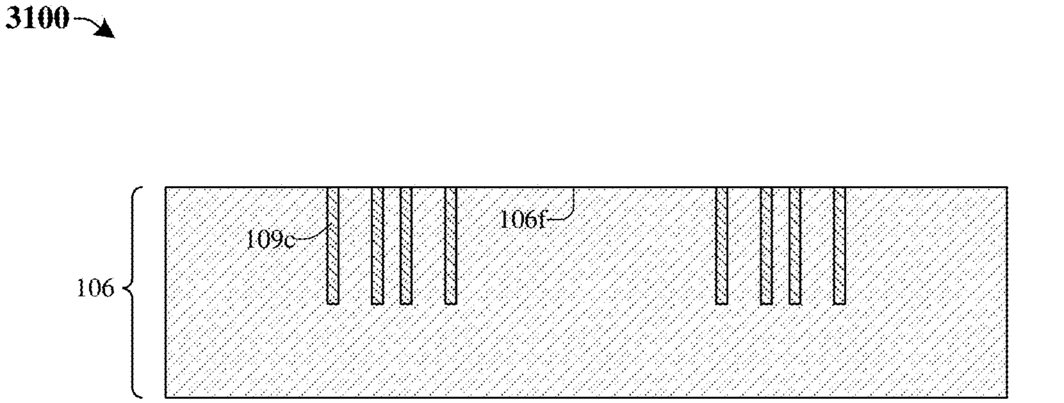

As shown in cross-sectional view 3100 of FIG. 31, a planarization process (e.g., a CMP process) is performed into the dielectric layer (3002 of FIG. 30) until a front-side **106*f* of the MEMS substrate 106 is reached, thereby forming a third spring layer 109*c* in the MEMS substrate 106**.

Figure 32:
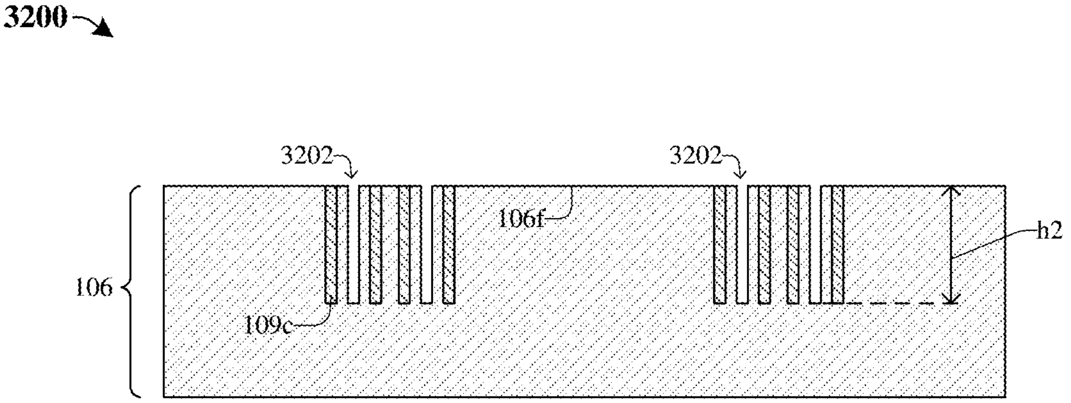

As shown in cross-sectional view 3200 of FIG. 32, the MEMS substrate 106 is patterned to define a plurality of openings 3202 within the MEMS substrate 106. In some embodiments, each opening 3202 is spaced laterally between adjacent segments of the third spring layer **109*c*. In some embodiments, patterning the MEMS substrate 106 includes: forming a masking layer (not shown) over the MEMS substrate 106; performing an etch process according to the masking layer, thereby defining the openings 3202**; and performing a removal process to remove the masking layer. In some embodiments, the etch process includes performing a dry etch process, such as a plasma etching process and/or a DRIE process.

In addition, each opening 3202 may be formed such that it has a height h2. In some embodiments, the height h2 may, for example, be within a range of about 25 to 200 micrometers, within a range of about 5 to 500 micrometers, within a range of about 0.5 to 100 micrometers, within a range of about 0.5 to 50 micrometers, within a range of about 50 to 100 micrometers, or less than about 5 micrometers. It will be appreciated that other values for the height h2 are also within the scope of the disclosure.

Figure 33:
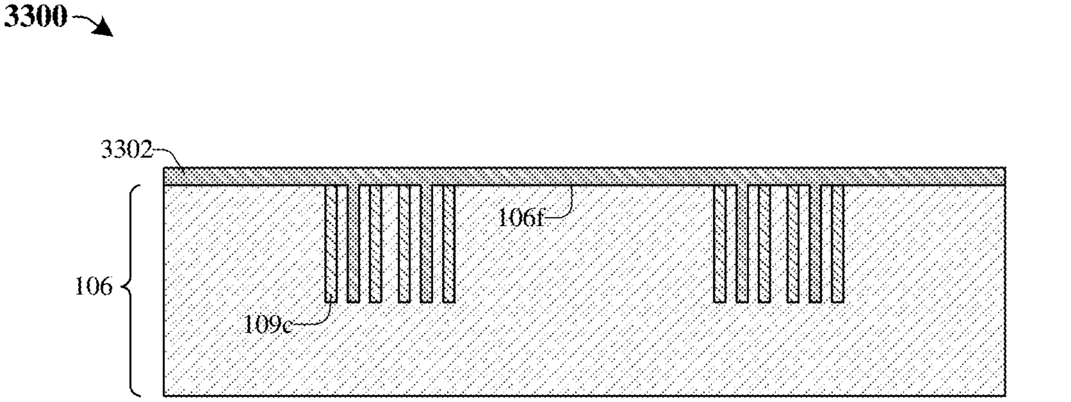

As shown in cross-sectional view 3300 of FIG. 33, a polysilicon layer 3302 is formed over the MEMS substrate 106, thereby filling the openings (3202 of FIG. 32). In some embodiments, the polysilicon layer 3302 may, for example, be or comprise polysilicon, intrinsic polysilicon, doped polysilicon, another material, or the like. In further embodiments, the polysilicon layer 3302 comprises a material different than the MEMS substrate 106 and/or different than the third spring layer **109*c*. In yet further embodiments, the polysilicon layer 3302** may be deposited by, for example, a CVD process, a PVD process, an ALD process, or another suitable growth or deposition process.

Figure 34:
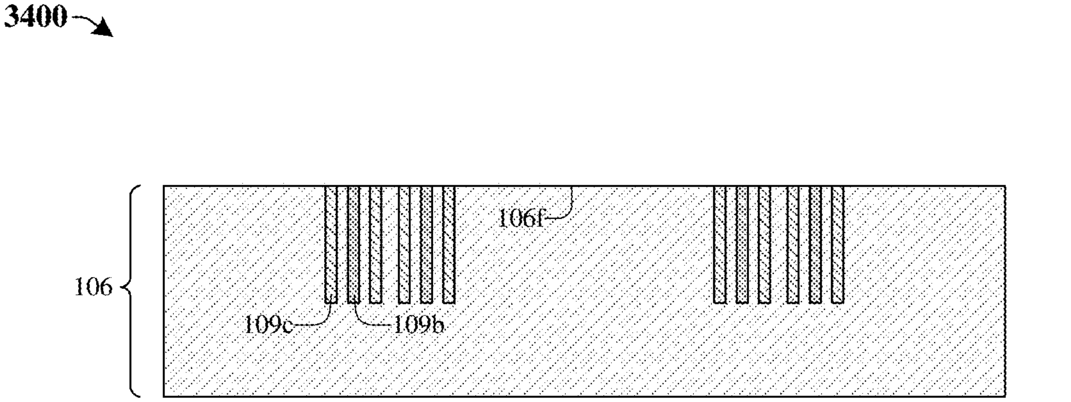

As shown in cross-sectional view 3400 of FIG. 34, a planarization process (e.g., a CMP process) is performed into the polysilicon layer (3302 of FIG. 33) until a front-side **106*f* of the MEMS substrate 106 is reached, thereby forming a second spring layer 109*b* in the MEMS substrate 106**.

Figure 35:
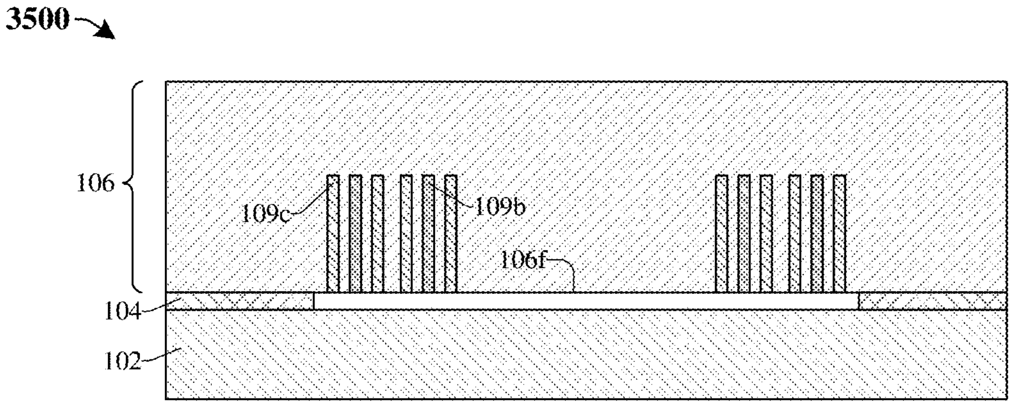

As shown in cross-sectional view 3500 of FIG. 35, a carrier substrate 102 and a lower bonding structure 104 are provided. Subsequently, the front-side **106*f* of the MEMS substrate 106 is bonded to the lower bonding structure 104. In some embodiments, the bonding process may, for example, be a fusion bonding process, a hybrid bonding process, or another suitable bonding process. In some embodiments, the carrier substrate 102 may, for example, be or comprise a bulk substrate (e.g., a bulk silicon substrate), a monocrystalline silicon substrate, an SOI substrate, or some other suitable substrate. In further embodiments, the lower bonding structure 104** may, for example, be or comprise an oxide, such as silicon dioxide, or another suitable material.

Figure 36:
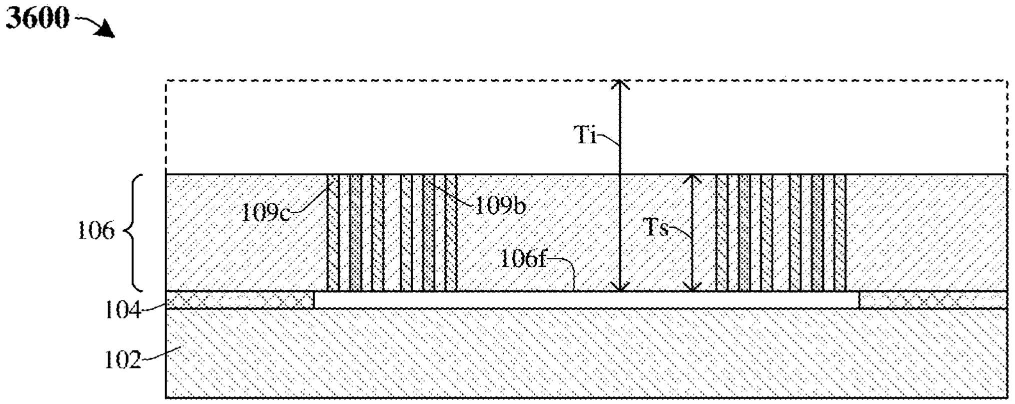

As shown in cross-sectional view 3600 of FIG. 36, a thinning process is performed on the MEMS substrate 106 to reduce an initial thickness Ti of the MEMS substrate 106 to a thickness Ts. In some embodiments, the thickness Ts may, for example, be within a range of about 25 to 200 micrometers, or within a range of about 5 to 500 micrometers. It will be appreciated that other values for the thickness Ts are also within the scope of the disclosure. In some embodiments, the thinning process is performed by a mechanical grinding process, a CMP process, some other thinning process, or any combination of the foregoing. For example, the thinning process may be performed wholly by a mechanical grinding process. Thus, in some embodiments, a thickness of the second spring layer **109*b* may, for example, be within a range of about 25 to 200 micrometers, within a range of about 5 to 500 micrometers, or another suitable thickness value. Further, in some embodiments, a thickness of the third spring layer 109*c*** may, for example, be within a range of about 25 to 200 micrometers, within a range of about 5 to 500 micrometers, or another suitable thickness value.

Figure 37:
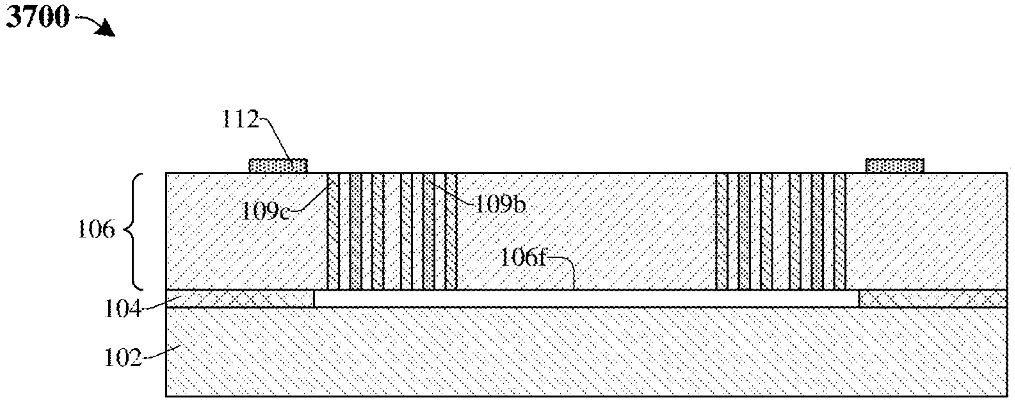

As shown in cross-sectional view 3700 of FIG. 37, contact electrodes 112 are formed over the MEMS substrate 106. In some embodiments, a process for forming the contact electrodes 112 may include: depositing (e.g., by CVD, PVD, sputtering, electroplating, electroless plating, etc.) a conductive layer over the MEMS substrate 106; forming a masking layer (not shown) over the conductive layer; patterning the conductive layer according to the masking layer, thereby defining the contact electrodes 112; and performing a removal process to remove the masking layer. In some embodiments, the contact electrodes 112 may, for example, be or comprise aluminum, copper, titanium, another suitable conductive material, or any combination of the foregoing.

Figure 38A:
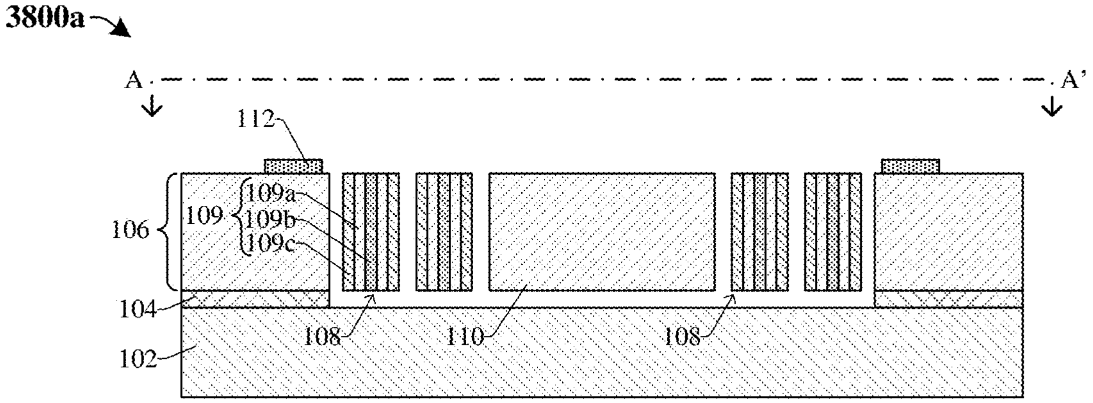
Figure 38B:
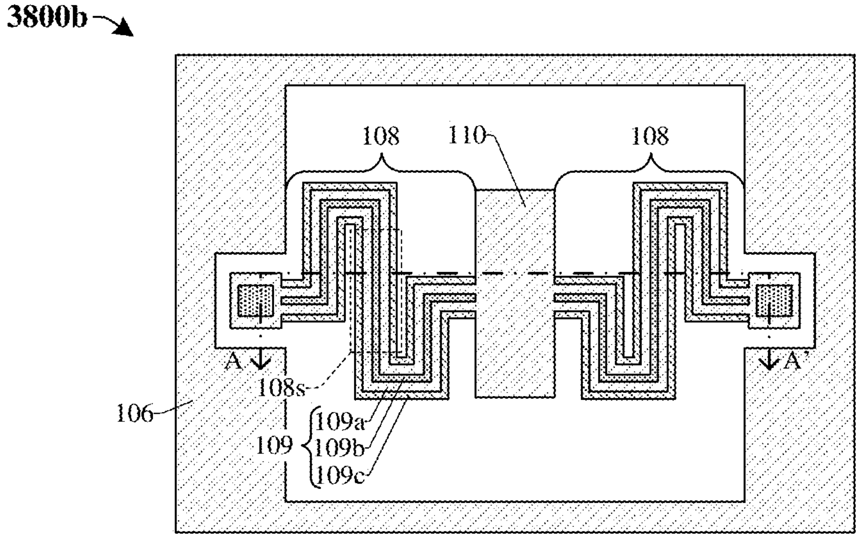

As shown in the cross-sectional view 3800*a* of FIG. 38A and the top view 3800*b* of FIG. 38B, the MEMS substrate 106 is patterned, thereby defining the moveable mass 110, the composite springs 108, and the first spring layer 109*a* of the composite structure 109. In some embodiments, patterning the MEMS substrate 106 includes: forming a masking layer (not shown) over the MEMS substrate 106 and the contact electrodes 112; performing an etch process according to the masking layer, thereby defining the moveable mass 110, the composite springs 108, and the first spring layer 109*a*; and performing a removal process to remove the masking layer. In some embodiments, the etch process includes performing a dry etch process, such as a plasma etching process and/or a DRIE process.

FIG. 38B illustrates the top view 3800*b* corresponding to some embodiments of the cross-sectional view 3800*a* of FIG. 38A taken along the line A-A' of FIG. 38A. FIG. 38B illustrates the layout of the composite springs 108 extending from a corresponding anchor structure 202 to the moveable mass 110. In further embodiments, the patterning process of the cross-sectional view 3800*a* of FIG. 38A may further define the anchor structures 202. In further embodiments, the first spring layer 109*a*, the second spring layer 109*b*, and the third spring layer 109*c* may each be formed and/or defined such that a top view layout of the composite structure 109 corresponds to any of the top views 700*a-h* of FIGS. 7A-H.

Figure 39:
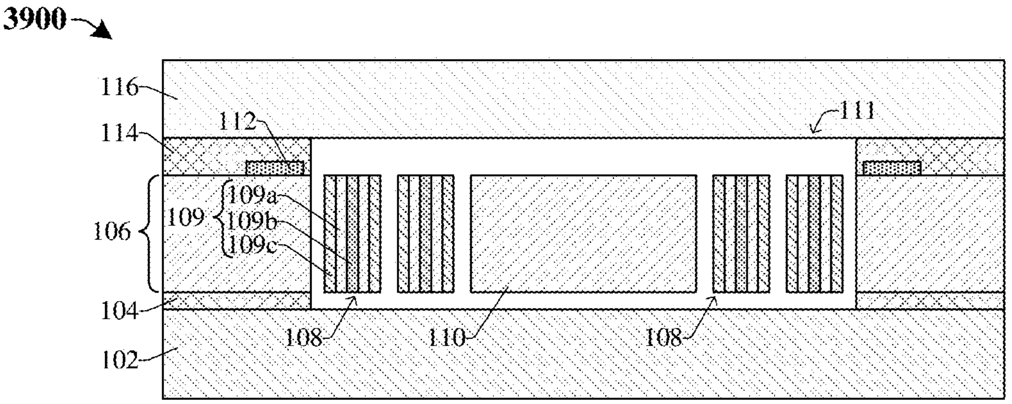

As shown in cross-sectional view 3900 of FIG. 39, a capping substrate 116 and an upper bonding structure 114 are provided. Subsequently, the capping substrate 116 is bonded to the MEMS substrate 106 by way of the upper bonding structure 114. In some embodiments, the bonding process may, for example, be a fusion bonding process, a hybrid bonding process, or another suitable bonding process. In some embodiments, the bonding process may, for example, define a cavity 111 between the carrier substrate 102 and the capping substrate 116, such that the cavity 111 has a first gas pressure. In further embodiments, the capping substrate 116 may, for example, be or comprise a bulk semiconductor substrate, such as a bulk silicon substrate, or an SOI substrate. In yet further embodiments, the upper bonding structure 114 may, for example, be or comprise an oxide, such as silicon dioxide, or another suitable dielectric material.

FIGS. 40-49 illustrate various views 4000-4900 of some embodiments of a fourth method for forming a MEMS structure including a composite spring and a moveable mass within a cavity according to the present disclosure. Although the various views 4000-4900 shown in FIGS. 40-49 are described with reference to a fourth method, it will be appreciated that the structures shown in FIGS. 40-49 are not limited to the fourth method but rather may stand alone separate of the method. Furthermore, although FIGS. 40-49 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 40:
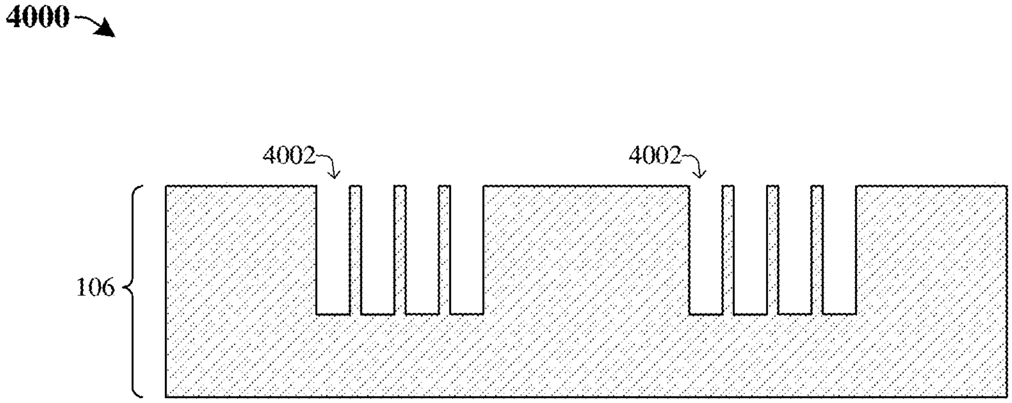
FIGS. 40-49 illustrate various views of some embodiments of a fourth method of forming a MEMS structure including composite springs and a moveable mass within a cavity.

As shown in cross-sectional view 4000 of FIG. 40, a MEMS substrate 106 is provided and is subsequently patterned to define a plurality of openings 4002 within the MEMS substrate 106. In some embodiments, the MEMS substrate 106 may, for example, be or comprise monocrystalline silicon (i.e., single-crystal silicon), intrinsic monocrystalline silicon, a bulk silicon substrate, an SOI substrate, another suitable semiconductor material, or the like. In some embodiments, patterning the MEMS substrate 106 includes: forming a masking layer (not shown) over the MEMS substrate 106; performing an etch process according to the masking layer, thereby defining the openings 4002; and performing a removal process to remove the masking layer. In some embodiments, the etch process includes performing a dry etch process, such as a plasma etching process and/or a DRIE process.

Figure 41:
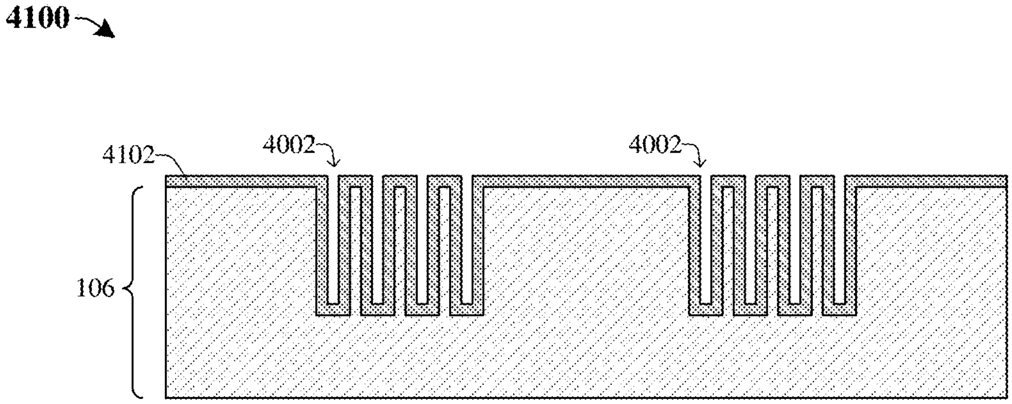

As shown in cross-sectional view 4100 of FIG. 41, a polysilicon layer 4102 is formed over the MEMS substrate 106, thereby lining the openings 4002. In some embodiments, the polysilicon layer 4102 may, for example, be or comprise polysilicon, intrinsic polysilicon, doped polysilicon, another material, or the like. In further embodiments, the polysilicon layer 4102 comprises a material different than the MEMS substrate 106. In yet further embodiments, the polysilicon layer 4102 may be deposited by, for example, a CVD process, a PVD process, or another suitable growth or deposition process.

Figure 42:
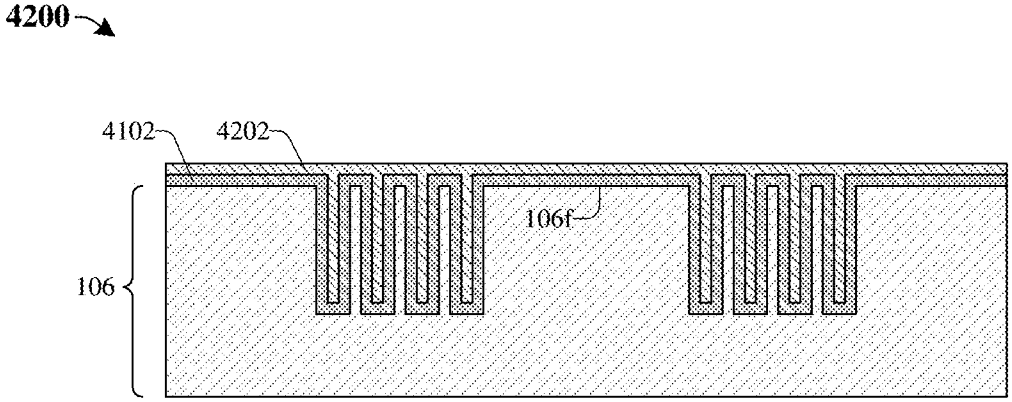

As shown in cross-sectional view 4200 of FIG. 42, a dielectric layer 4202 is formed over the MEMS substrate 106 and the polysilicon layer 4102, thereby filling the openings (4002 of FIG. 41). In some embodiments, the dielectric layer 4202 may, for example, be or comprise amorphous silicon, amorphous silicon dioxide, another material, or the like. In further embodiments, the dielectric layer 4202 comprises a material different than the MEMS substrate 106 and/or different than the polysilicon layer 4102. In yet further embodiments, the dielectric layer 4202 may be deposited by, for example, a CVD process, a PVD process, an ALD process, thermal oxidation, or another suitable growth or deposition process.

Figure 43:
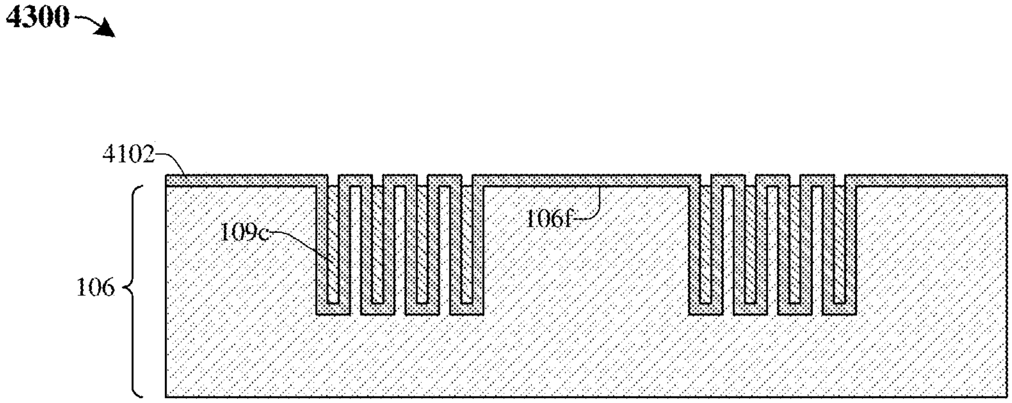

As shown in cross-sectional view 4300 of FIG. 43, a patterning process is performed on the dielectric layer (4202 of FIG. 42), thereby defining the third spring layer 109*c*. In some embodiments, patterning the dielectric layer (4204 of FIG. 42) includes performing a wet etch process, a dry etch process, another suitable etch process, or any combination of the foregoing.

Figure 44:
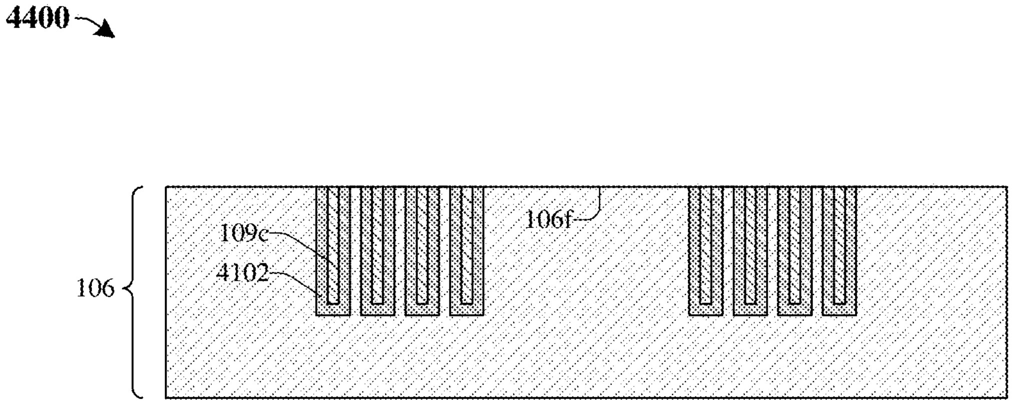

As shown in cross-sectional view 4400 of FIG. 44, a planarization process (e.g., a CMP process) is performed into the polysilicon layer 4102 until a front-side 106*f* of the MEMS substrate 106 is reach, thereby removing at least a portion of the polysilicon layer 4102.

Figure 45:
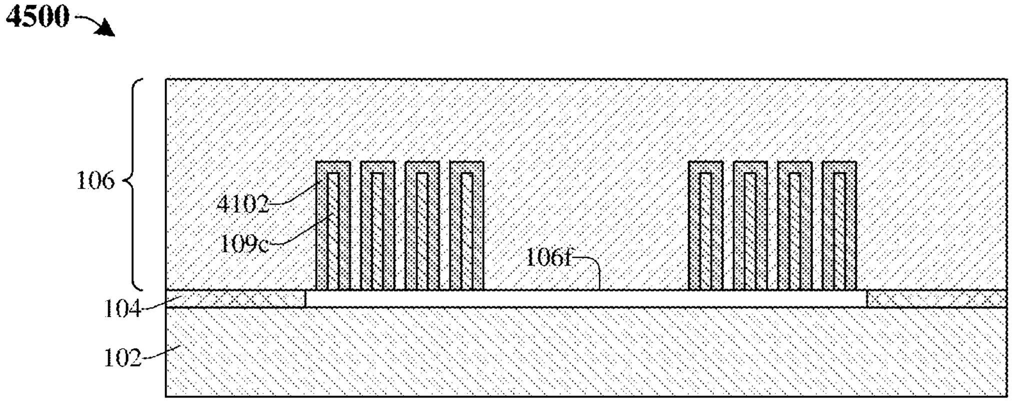

As shown in cross-sectional view 4500 of FIG. 45, a carrier substrate 102 and a lower bonding structure 104 are provided. Subsequently, the front-side 106*f* of the MEMS substrate 106 is bonded to the lower bonding structure 104. In some embodiments, the bonding process may, for example, be a fusion bonding process, a hybrid bonding process, or another suitable bonding process. In some embodiments, the carrier substrate 102 may, for example, be or comprise a bulk substrate (e.g., a bulk silicon substrate), a monocrystalline silicon substrate, an SOI substrate, or some other suitable substrate. In further embodiments, the lower bonding structure 104 may, for example, be or comprise an oxide, such as silicon dioxide, or another suitable material.

Figure 46:
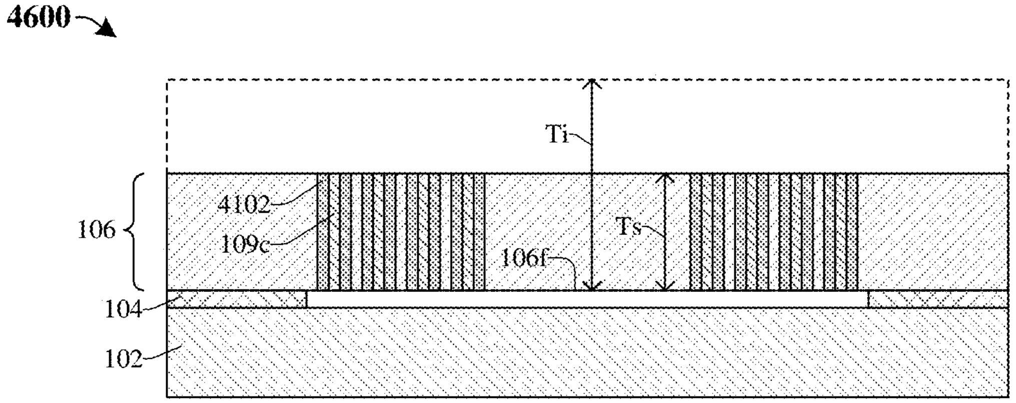

As shown in cross-sectional view 4600 of FIG. 46, a thinning process is performed on the MEMS substrate 106 to reduce an initial thickness Ti of the MEMS substrate 106 to a thickness Ts. In some embodiments, the thinning process is performed by a mechanical grinding process, a CMP process, some other thinning process, or any combination of the foregoing. For example, the thinning process may be performed wholly by a mechanical grinding process. In further embodiments, the thinning process removes at least a portion of the polysilicon layer 4102.

Figure 47:
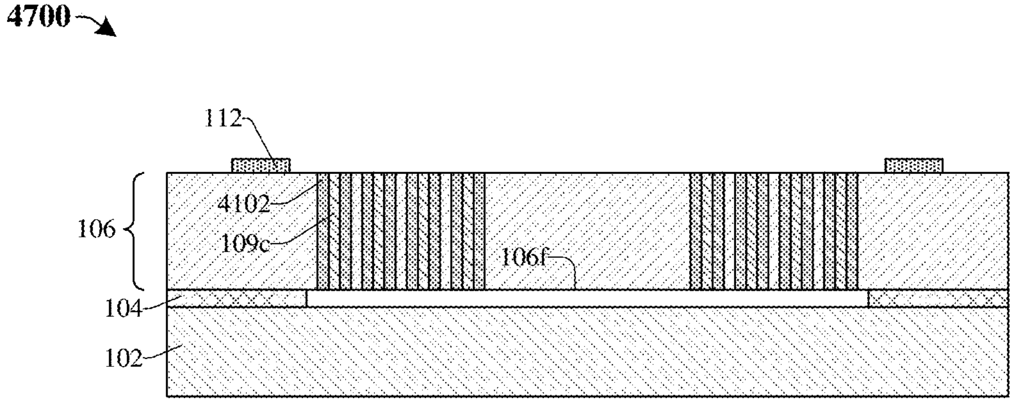

As shown in cross-sectional view 4700 of FIG. 47, contact electrodes 112 are formed over the MEMS substrate 106. In some embodiments, a process for forming the contact electrodes 112 may include: depositing (e.g., by CVD, PVD, sputtering, electroplating, electroless plating, etc.) a conductive layer over the MEMS substrate 106; forming a masking layer (not shown) over the conductive layer; patterning the conductive layer according to the masking layer, thereby defining the contact electrodes 112; and performing a removal process to remove the masking layer. In some embodiments, the contact electrodes 112 may, for example, be or comprise aluminum, copper, titanium, another suitable conductive material, or any combination of the foregoing.

Figure 48A:
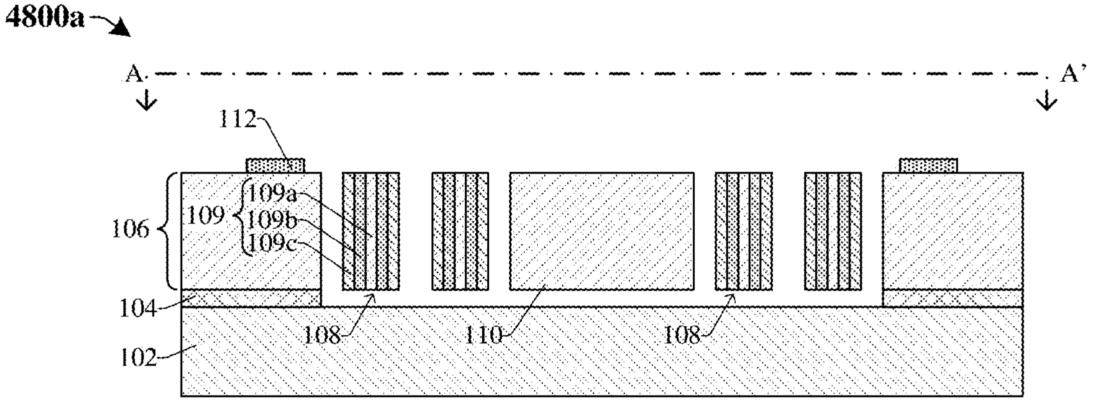
Figure 48B:
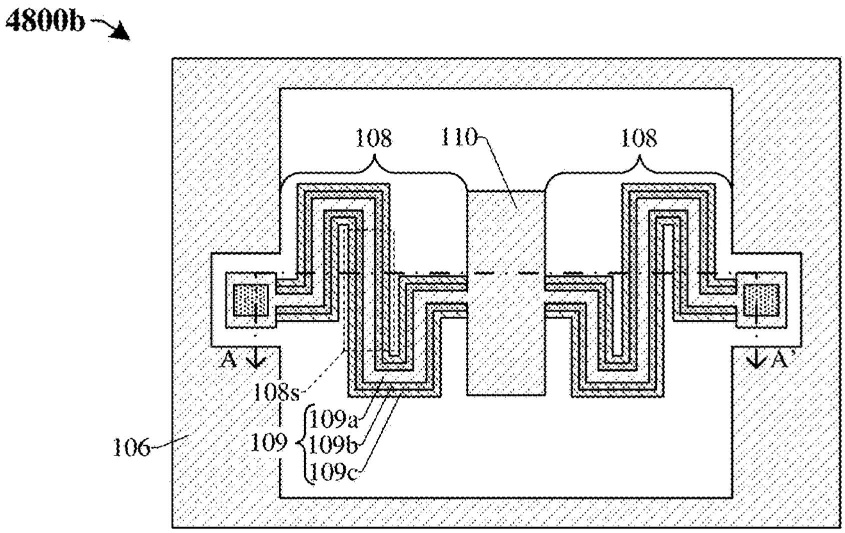

As shown in the cross-sectional view 4800*a* of FIG. 48A and the top view 4800*b* of FIG. 48B, the MEMS substrate 106 and the polysilicon layer (4102 of FIG. 47) are patterned, thereby defining the moveable mass 110, the composite springs 108, and the first spring layer 109*a* and the second spring layer 109*b* of the composite structure 109. In some embodiments, patterning the MEMS substrate 106 and the polysilicon layer (4102 of FIG. 47) includes: forming a masking layer (not shown) over the MEMS substrate 106 and the contact electrodes 112; performing an etch process according to the masking layer, thereby defining the moveable mass 110, the composite springs 108, the first spring layer 109*a*, and the second spring layer 109*b*; and performing a removal process to remove the masking layer. In some embodiments, the etch process includes performing a dry etch process, such as a plasma etching process and/or DRIE process.

FIG. 48B illustrates the top view 4800*b* corresponding to some embodiments of the cross-sectional view 4800*a* of FIG. 48A taken along the line A-A' of FIG. 48A. FIG. 48B illustrates the layout of the composite springs 108 extending from a corresponding anchor structure 202 to the moveable mass 110. In further embodiments, the patterning process of the cross-sectional view 4800*a* of FIG. 48A may further define the anchor structure 202. In further embodiments, the first spring layer 109*a*, the second spring layer 109*b*, and the third spring layer 109*c* may each be formed and/or defined such that a top view layout of the composite structure 109 corresponds to any of the top views 900*a-f* of FIG. 9A-F.

Figure 49:
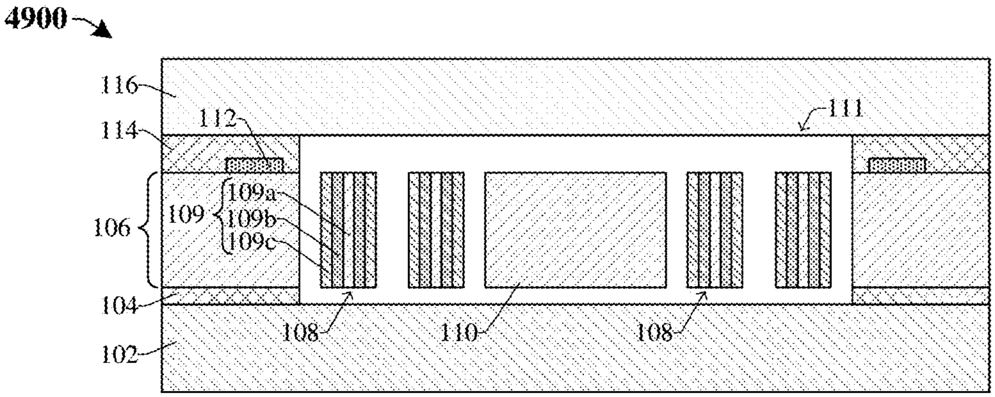

As shown in cross-sectional view 4900 of FIG. 49, a capping substrate 116 and an upper bonding structure 114 are provided. Subsequently, the capping substrate 116 is bonded to the MEMS substrate 106 by way of the upper bonding structure 114. In some embodiments, the bonding process may, for example, be a fusion bonding process, a hybrid bonding process, or another suitable bonding process. In some embodiments, the bonding process may, for example, define a cavity 111 between the carrier substrate 102 and the capping substrate 116, such that the cavity 111 has a first gas pressure. In further embodiments, the capping substrate 116 may, for example, be or comprise a bulk semiconductor substrate, such as a bulk silicon substrate, or an SOI substrate. In yet further embodiments, the upper bonding structure 114 may, for example, be or comprise an oxide, such as silicon dioxide, or another suitable dielectric material.

FIGS. 50-60 illustrate various views 5000-6000 of some embodiments of a fifth method for forming a MEMS structure including a composite spring and a moveable mass within a cavity according to the present disclosure. Although the various views 5000-6000 shown in FIGS. 50-60 are described with reference to a fifth method, it will be appreciated that the structures shown in FIGS. 50-60 are not limited to the fifth method but rather may stand alone separate of the method. Furthermore, although FIGS. 50-60 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

As shown in cross-sectional view 5000 of FIG. 50, a MEMS substrate 106 is provided and is subsequently patterned to define a plurality of openings 5002 within the MEMS substrate 106. In some embodiments, the MEMS substrate 106 may, for example, be or comprise monocrystalline silicon (i.e., single-crystal silicon), intrinsic monocrystalline silicon, a bulk silicon substrate, an SOI substrate, another suitable semiconductor material, or the like. In some embodiments, patterning the MEMS substrate 106 includes: forming a masking layer (not shown) over the MEMS substrate 106; performing an etch process according to the masking layer, thereby defining the openings 5002; and performing a removal process to remove the masking layer. In some embodiments, the etch process includes performing a dry etch process, such as a plasma etching process and/or a DRIE process.

Figure 50:
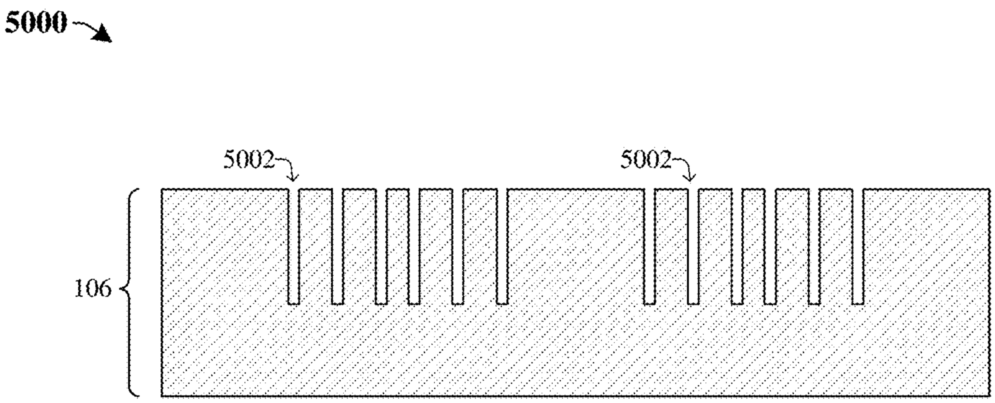
FIGS. 50-60 illustrate various views of some embodiments of a fifth method of forming a MEMS structure including composite springs and a moveable mass within a cavity.
Figure 51:
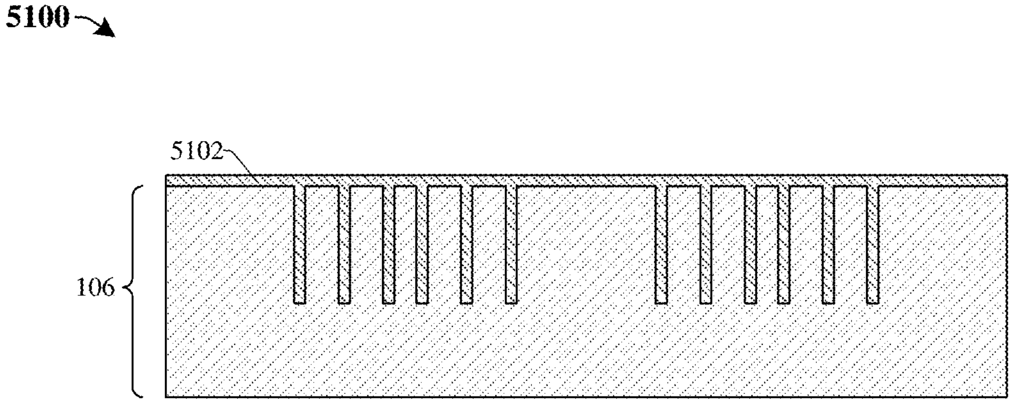

As shown in cross-sectional view 5100 of FIG. 51, a dielectric layer 5102 is formed over the MEMS substrate 106, thereby filling the openings (5002 of FIG. 50). In some embodiments, the dielectric layer 5102 may, for example, be or comprise amorphous silicon, amorphous silicon dioxide, or the like. In further embodiments, the dielectric layer 5102 comprises a material different than the MEMS substrate 106. In yet further embodiments, the dielectric layer 5102 may be deposited by, for example, a CVD process, a PVD process, thermal oxidation, or another suitable growth or deposition process.

Figure 52:
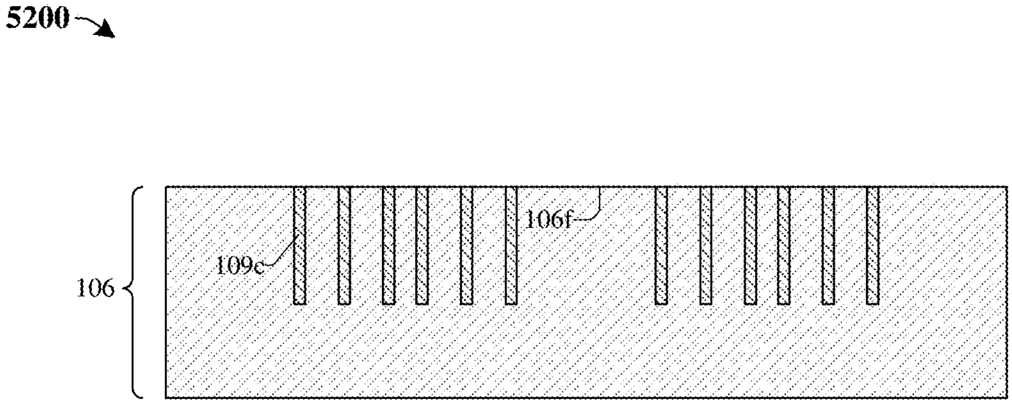

As shown in cross-sectional view 5200 of FIG. 52, a planarization process (e.g., a CMP process) is performed into the dielectric layer (5102 of FIG. 51) until a front-side 106*f* of the MEMS substrate 106 is reached, thereby forming a third spring layer 109*c* in the MEMS substrate 106.

Figure 53:
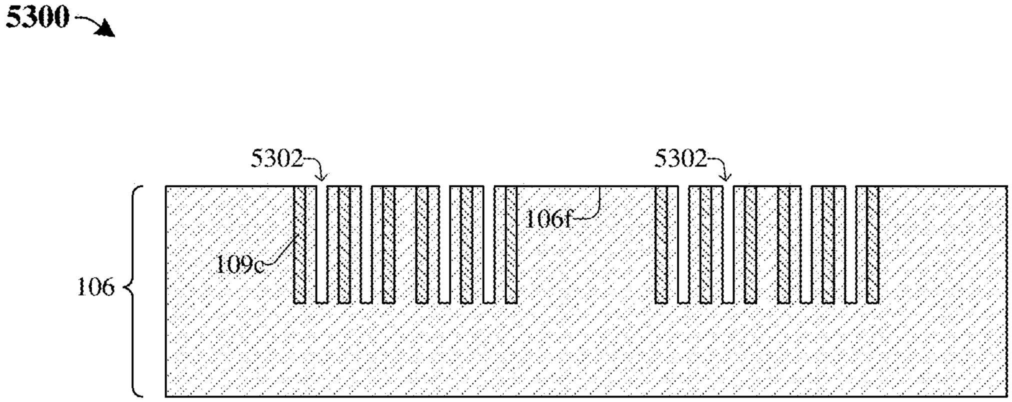

As shown in cross-sectional view 5300 of FIG. 53, the MEMS substrate 106 is patterned to define a plurality of openings 5302 within the MEMS substrate 106. In some embodiments, each opening 5302 is spaced laterally between adjacent segments of the third spring layer 109*c*. In some embodiments, patterning the MEMS substrate 106 includes: forming a masking layer (not shown) over the MEMS substrate 106; performing an etch process according to the masking layer, thereby defining the openings 5302; and performing a removal process to remove the masking layer. In some embodiments, the etch process includes performing a dry etch process, such as a plasma etching process and/or a DRIE process.

Figure 54:
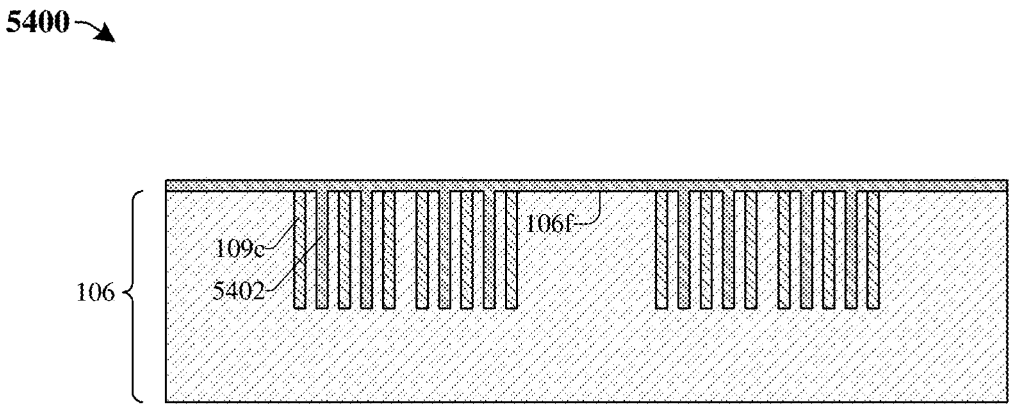

As shown in cross-sectional view 5400 of FIG. 54, a polysilicon layer 5402 is formed over the MEMS substrate 106, thereby filling the openings (5302 of FIG. 53). In some embodiments, the polysilicon layer 5402 may, for example, be or comprise polysilicon, intrinsic polysilicon, doped polysilicon, or the like. In further embodiments, the polysilicon layer 5402 comprises a material different than the MEMS substrate 106 and/or different than the third spring layer 109*c*. In yet further embodiments, the polysilicon layer 5402 may be deposited by, for example, a CVD process, a PVD process, an ALD process, or another suitable growth or deposition process.

Figure 55:
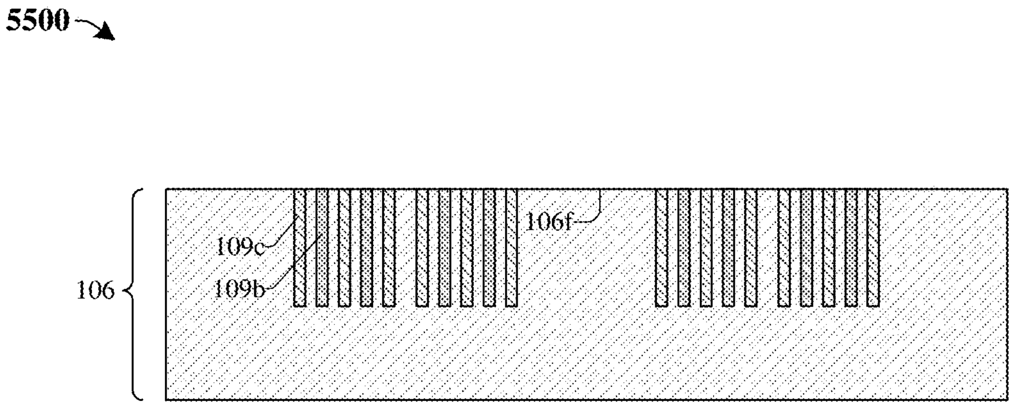

As shown in cross-sectional view 5500 of FIG. 55, a planarization process (e.g., a CMP process) is performed into the polysilicon layer (5402 of FIG. 54) until a front-side 106*f* of the MEMS substrate 106 is reached, thereby forming a second spring layer 109*b* in the MEMS substrate 106.

Figure 56:
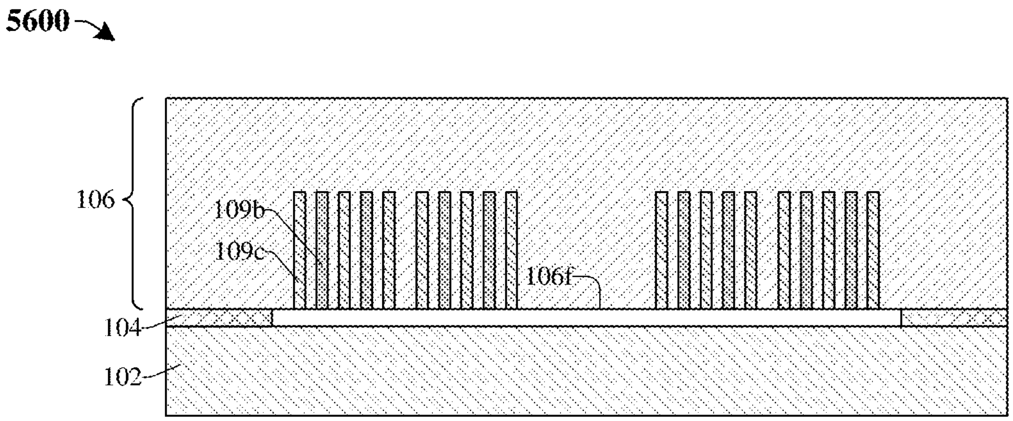

As shown in cross-sectional view 5600 of FIG. 56, a carrier substrate 102 and a lower bonding structure 104 are provided. Subsequently, the front-side 106*f* of the MEMS substrate 106 is bonded to the lower bonding structure 104. In some embodiments, the bonding process may, for example, be a fusion bonding process, a hybrid bonding process, or another suitable bonding process. In some embodiments, the carrier substrate 102 may, for example, be or comprise a bulk substrate (e.g., a bulk silicon substrate), a monocrystalline silicon substrate, an SOI substrate, or some other suitable substrate. In further embodiments, the lower bonding structure 104 may, for example, be or comprise an oxide, such as silicon dioxide, or another suitable material.

Figure 57:
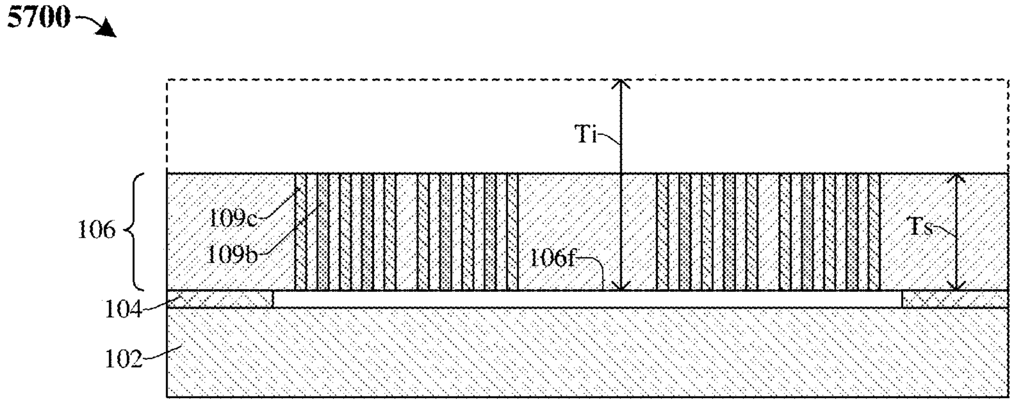

As shown in cross-sectional view 5700 of FIG. 57, a thinning process is performed on the MEMS substrate 106 to reduce an initial thickness Ti of the MEMS substrate 106 to a thickness Ts. In some embodiments, the thinning process is performed by a mechanical grinding process, a CMP process, some other thinning process, or any combination of the foregoing. For example, the thinning process may be performed wholly by a mechanical grinding process.

Figure 58:
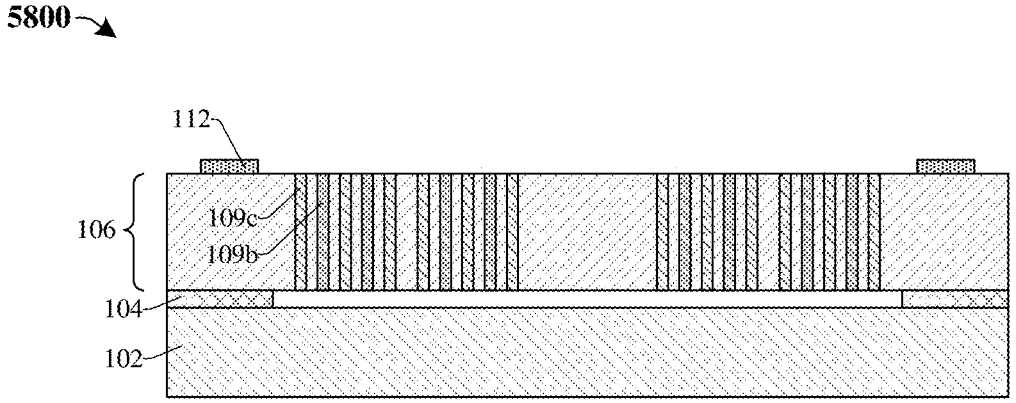

As shown in cross-sectional view 5800 of FIG. 58, contact electrodes 112 are formed over the MEMS substrate 106. In some embodiments, a process for forming the contact electrodes 112 may include: depositing (e.g., by CVD, PVD, sputtering, electroplating, electroless plating, etc.) a conductive layer over the MEMS substrate 106; forming a masking layer (not shown) over the conductive layer; patterning the conductive layer according to the masking layer, thereby defining the contact electrodes 112; and performing a removal process to remove the masking layer. In some embodiments, the contact electrodes 112 may, for example, be or comprise aluminum, copper, titanium, another suitable conductive material, or any combination of the foregoing.

Figure 59A:
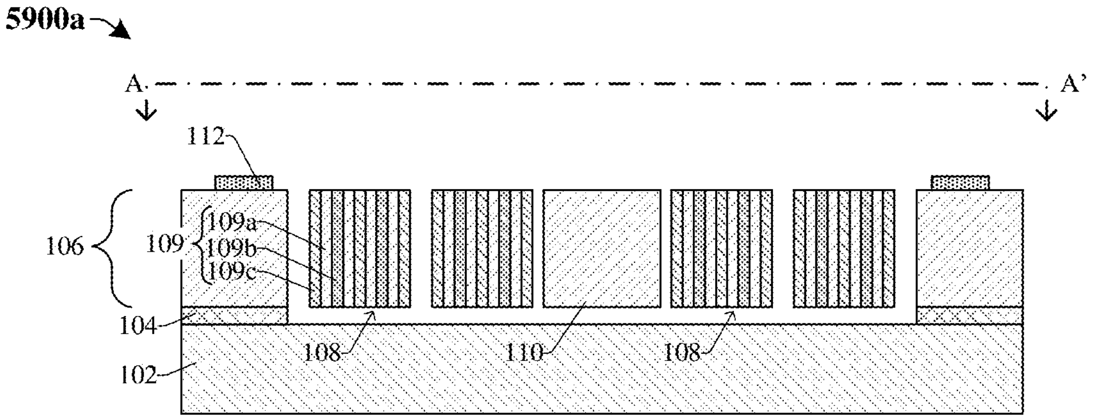
Figure 59B:
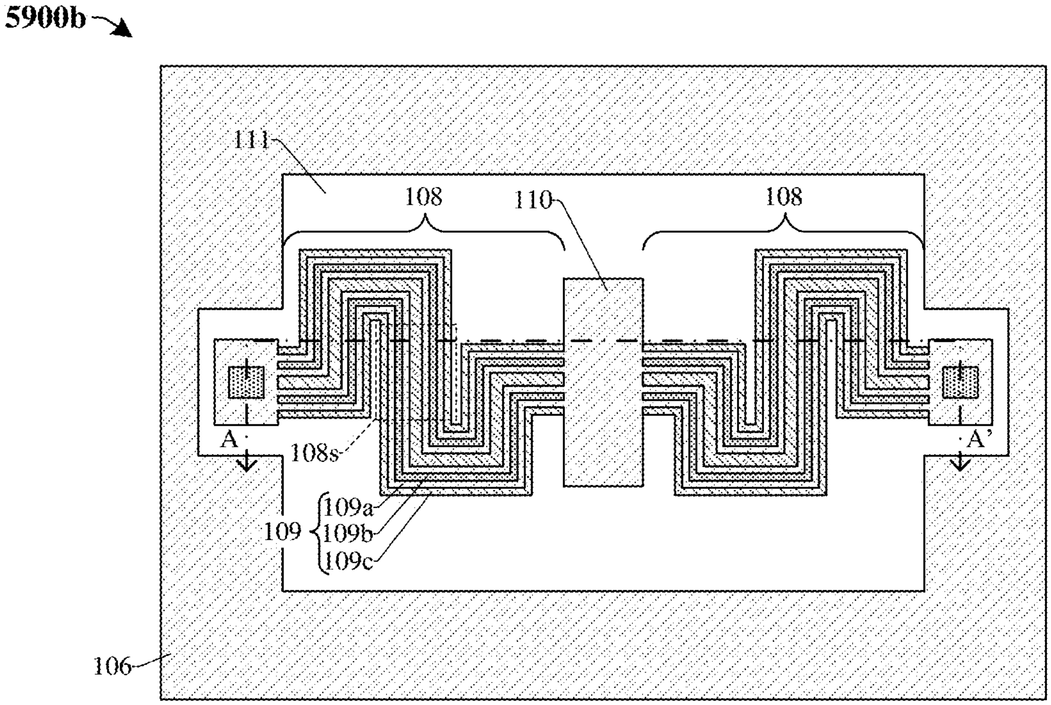

As shown in the cross-sectional view 5900*a* of FIG. 59A and the top view 5900*b* of FIG. 59B, the MEMS substrate 106 is patterned, thereby defining the moveable mass 110, the composite springs 108, and the first spring layer 109*a* of the composite structure 109. In some embodiments, patterning the MEMS substrate 106 includes: forming a masking layer (not shown) over the MEMS substrate 106 and the contact electrodes 112; performing an etch process according to the masking layer, thereby defining the moveable mass 110, the composite springs 108, and the first spring layer 109*a*; and performing a removal process to remove the masking layer. In some embodiments, the etch process includes performing a dry etch process, such as a plasma etching process and/or a DRIE process.

FIG. 59B illustrates the top view 5900*b* corresponding to some embodiments of the cross-sectional view 5900*a* of FIG. 59A taken along the line A-A' of FIG. 59A. FIG. 59B illustrates the layout of the composite springs 108 extending from a corresponding anchor structure 202 to the moveable mass 110. In further embodiments, the patterning process of the cross-sectional view 5900*a* of FIG. 59A may further define the anchor structures 202. In further embodiments, the first spring layer 109*a*, the second spring layer 109*b*, and the third spring layer 109*c* may each be formed and/or defined such that a top view layout of the composite structure 109 corresponds to any of the top views 1100*a-f* of FIGS. 11A-F.

Figure 60:
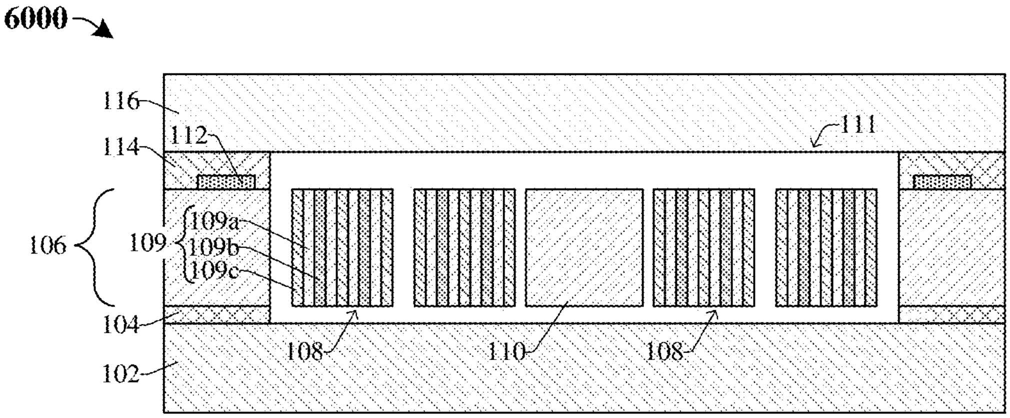

As shown in cross-sectional view 6000 of FIG. 60, a capping substrate 116 and an upper bonding structure 114 are provided. Subsequently, the capping substrate 116 is bonded to the MEMS substrate 106 by way of the upper bonding structure 114. In some embodiments, the bonding process may, for example, be a fusion bonding process, a hybrid bonding process, or another suitable bonding process. In some embodiments, the bonding process may, for example, define a cavity 111 between the carrier substrate 102 and the capping substrate 116, such that the cavity 111 has a first gas pressure. In further embodiments, the capping substrate 116 may, for example, be or comprise a bulk semiconductor substrate, such as a bulk silicon substrate, or an SOI substrate. In yet further embodiments, the upper bonding structure 114 may, for example, be or comprise an oxide, such as silicon dioxide, or another suitable dielectric material.

Figure 61:
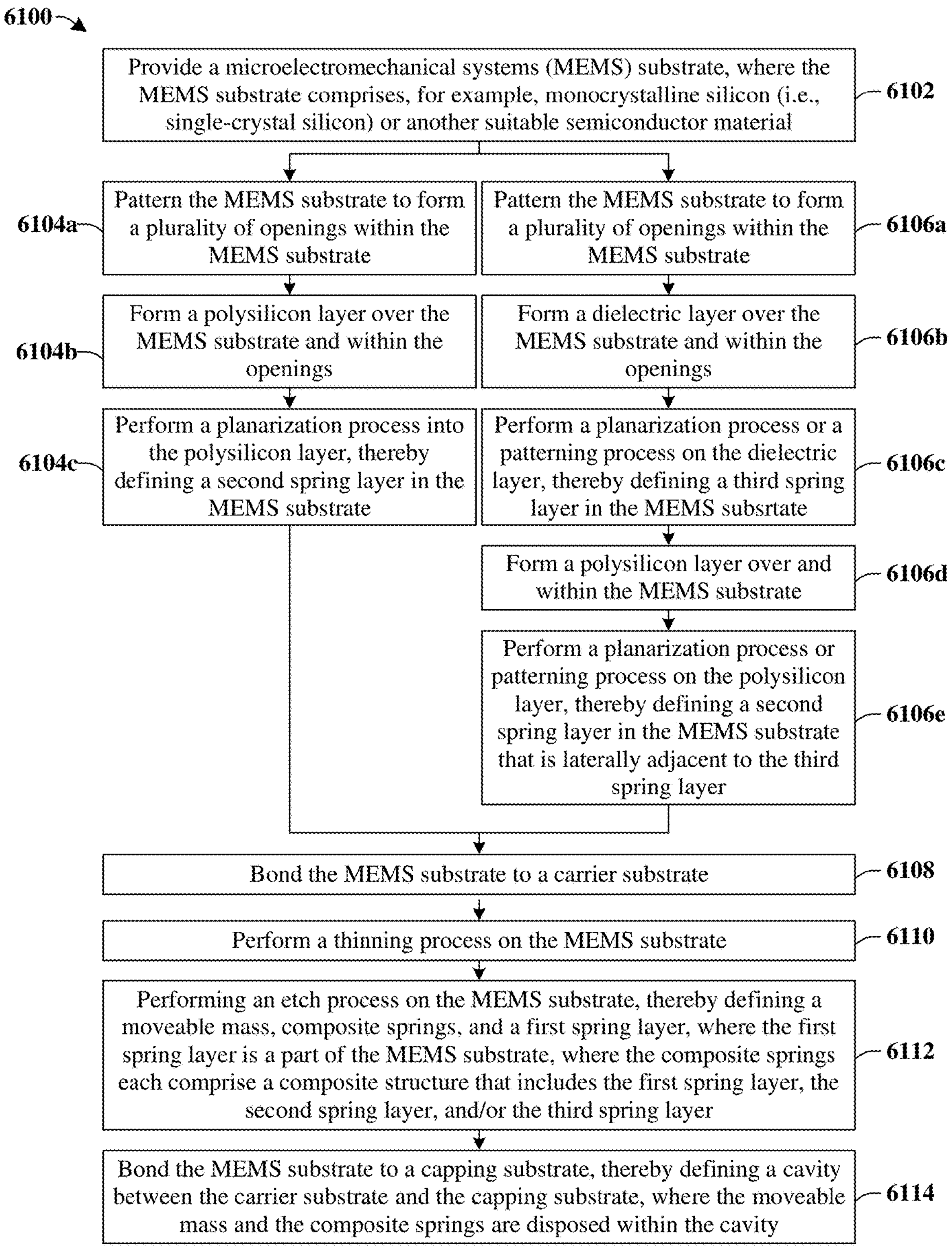
FIG. 61 illustrates a method in flowchart format that illustrates some embodiments for forming a MEMS structure including composite springs and a moveable mass within a cavity.

FIG. 61 illustrates a method 6100 of forming a MEMS structure including a composite spring and a moveable mass within a cavity according to the present disclosure. Although the method 6100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 6102, a microelectromechanical systems (MEMS) substrate is provided. The MEMS substrate comprises, for example, monocrystalline silicon (i.e., single-crystal silicon) or another suitable semiconductor material. FIGS. 13, 21, 29, 40, and 50 illustrate cross-sectional views 1300, 2100, 2900, 4000, and 5000 corresponding to various embodiments of act 6102.

At act 6104*a*, the MEMS substrate is patterned, thereby forming a plurality of openings within the MEMS substrate. FIGS. 13 and 21 illustrate cross-sectional views 1300 and 2100 corresponding to various embodiments of act 6104*a*.

At act 6104*b*, a polysilicon layer is formed over the MEMS substrate and within the openings. FIGS. 14 and 22 illustrate cross-sectional views 1400 and 2200 corresponding to various embodiments of act 6104*b*.

At act 6104*c*, a planarization process is performed on the polysilicon layer, thereby defining a second spring layer in the MEMS substrate. FIGS. 15 and 23 illustrate cross-sectional views 1500 and 2300 corresponding to various embodiments of act 6104*c*.

At act 6106*a*, the MEMS substrate is patterned, thereby forming a plurality of openings within the MEMS substrate. FIGS. 29, 40, and 50 illustrate cross-sectional views 2900, 4000, and 5000 corresponding to various embodiments of act 6106*a*.

At act 6106*b*, a dielectric layer is formed over the MEMS substrate and within the openings. FIGS. 30, 42, and 51 illustrate cross-sectional views 3000, 4200, and 5100 corresponding to various embodiments of act 6106*b*.

At act 6106*c*, a planarization process or a patterning process is performed on the dielectric layer, thereby defining a third spring layer in the MEMS substrate. FIGS. 31, 43, and 52 illustrate cross-sectional views 3100, 4300, and 5200 corresponding to various embodiments of act 6106*c*.

At act 6106*d*, a polysilicon layer is formed over and within the MEMS substrate. FIGS. 33, 41, and 54 illustrate cross-sectional views 3300, 4100, and 5400 corresponding to various embodiments of act 6106*d*.

At act 6106*e*, a planarization process or a patterning process is performed on the polysilicon layer, thereby defining a second spring layer in the MEMS substrate that is laterally adjacent to the third spring layer. FIGS. 34, 44 and 48A, and 55 illustrate cross-sectional views 3400, 4400 and 4800*a*, and 5500 corresponding to various embodiments of act 6106*e*.

At act 6108, the MEMS substrate is bonded to a carrier substrate. FIGS. 16, 24, 35, 45, and 56 illustrate cross-sectional views 1600, 2400, 3500, 4500, and 5600 corresponding to various embodiments of act 6108.

At act 6110, a thinning process is performed on the MEMS substrate. FIGS. 17, 25, 36, 46, and 57 illustrate cross-sectional views 1700, 2500, 3600, 4600, and 5700 corresponding to various embodiments of act 6110.

At act 6112, an etching process is performed on the MEMS substrate, thereby defining a moveable mass, composite springs, and a first spring layer. The first spring layer is a part of the MEMS substrate. In addition, the composite springs each comprise a composite structure that includes the first spring layer, the second spring layer, and/or the third spring layer. FIGS. 19A-B, 27A-B, 38A-B, 48A-B, and 59A-B illustrate various views 1900*a-b*, 2700*a-b*, 3800*a-b*, 4800*a-b*, and 5900*a-b* corresponding to various embodiments of act 6112.

At act 6114, the MEMS substrate is bonded to a capping substrate, thereby defining a cavity between the carrier substrate and the capping substrate. The moveable mass and the composite springs are disposed within the cavity. FIGS. 20, 28, 39, 49, and 60 illustrate cross-sectional views 2000, 2800, 3900, 4900, and 6000 corresponding to various embodiments of act 6114.

Accordingly, in some embodiments, the present disclosure relates to a MEMS structure comprising a MEMS substrate. The MEMS substrate comprises composite spring (s) and a moveable mass disposed within a cavity. The composite spring(s) is/are configured to suspend the moveable mass within the cavity and comprise(s) a composite structure that includes two or more spring layers. The two or more spring layers each comprise a semiconductor material different from one another.

In some embodiments, the present application provides a microelectromechanical systems (MEMS) structure including: a first substrate; a second substrate overlying the first substrate; a third substrate overlying the second substrate, wherein the first, second, and third substrates at least partially define a cavity, and wherein the second substrate includes a moveable mass in the cavity and between the first and third substrates; and a composite spring extending from a peripheral region of the second substrate to the moveable mass, wherein the composite spring is configured to suspend the moveable mass in the cavity, and wherein the composite spring includes a first spring layer comprising a first crystal orientation and a second spring layer comprising a second crystal orientation different than the first crystal orientation.

In some embodiments, the present application provides an integrated chip including: a microelectromechanical systems (MEMS) substrate including an anchor structure and a moveable element disposed next to the anchor structure; a carrier substrate underlying the MEMS substrate, wherein the MEMS substrate and the carrier substrate at least partially define a cavity within which the moveable element is in; and a composite spring extending continuously from the anchor structure to the moveable element, wherein the composite spring includes a first spring layer comprising monocrystalline silicon and a second spring layer comprising polysilicon.

In some embodiments, the present application provides a method for forming a microelectromechanical systems (MEMS) structure, the method including: providing a MEMS substrate that comprises monocrystalline silicon; forming a polysilicon layer within the MEMS substrate; bonding the MEMS substrate to a carrier substrate; and patterning the MEMS substrate to delineate a composite spring of the MEMS substrate and a moveable mass of the MEMS substrate, wherein the composite spring includes a first spring layer comprising at least a segment of the MEMS substrate and a second spring layer comprising the polysilicon layer, wherein the composite spring extends continuously from a peripheral region of the MEMS substrate to the moveable mass.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first substrate;

a second substrate overlying the first substrate, wherein the first and second substrates at least partially define a cavity;

a microelectromechanical systems (MEMS) component in the cavity; and a spring structure disposed between a region of the second substrate and the MEMS component, wherein the spring structure comprises a first layer having a first flexural strength and a second layer having a second flexural strength different from the first flexural strength, wherein the first layer continuously extends along a first vertical surface of the second layer, and wherein the spring structure has a third flexural strength greater than the first flexural strength and the second flexural strength.

2. The semiconductor structure of claim 1, wherein the first and second layers comprise different materials.

3. The semiconductor structure of claim 1, wherein the first vertical surface of the second layer continuously extends along a second vertical surface of the second layer, wherein the first vertical surface is opposite the second vertical surface.

4. The semiconductor structure of claim 1, wherein an upper surface of the first layer is aligned with an upper surface of the second layer.

5. The semiconductor structure of claim 1, wherein a height of the first layer is equal to a height of the second layer.

6. The semiconductor structure of claim 1, wherein when viewed in top view the first and second layers respectively comprise a first lateral segment extending from the region of the second substrate in a first direction and a second lateral segment extending from the first lateral segment in a second direction, wherein the first direction is substantially orthogonal to the second direction.

7. The semiconductor structure of claim 1, wherein when viewed in top view the first layer comprises a first L-shaped segment laterally adjacent to and directly contacting a second L-shaped segment of the second layer.

8. The semiconductor structure of claim 1, wherein when viewed from above a first lateral segment of the first layer comprises an opening that extends through a height of the spring structure, wherein the opening is aligned along a center of a width of the first lateral segment, and wherein a width of the opening is less than the width of the first lateral segment.

9. A semiconductor structure, comprising:

a first substrate overlying a base structure;

a movable component over the base structure; and a suspension structure arranged between the movable component and a sidewall of the first substrate, wherein a crystal orientation of the suspension structure changes at least two times along a lateral distance between the sidewall of the first substrate and a sidewall of the movable component.

10. The semiconductor structure of claim 9, wherein the suspension structure comprises a first suspension layer and a second suspension layer directly contacting the first suspension layer.

11. The semiconductor structure of claim 10, wherein the first suspension layer continuously laterally extends around an outer perimeter of the second suspension layer.

12. The semiconductor structure of claim 10, wherein when viewed from above the second suspension layer has a plurality of sidewalls defining a grid layout, wherein the first suspension layer is disposed along the plurality of sidewalls.

13. The semiconductor structure of claim 10, wherein when viewed from above the second suspension layer comprises an elongated segment and a plurality of short segments extending outward from the elongated segment, wherein the first suspension layer continuously extends from the short segments to the elongated segment.

14. The semiconductor structure of claim 10, wherein the suspension structure further includes a third suspension layer contacting the first suspension layer or the second suspension layer.

15. The semiconductor structure of claim 14, wherein the first suspension layer, the second suspension layer, and the third suspension layer directly contact the sidewall of the movable component.

16. The semiconductor structure of claim 14, wherein a first sidewall of the first suspension layer and a second sidewall of the second suspension layer are aligned with a first plane, and wherein the third suspension layer directly contacts the first and second sidewalls along the first plane.

17. The semiconductor structure of claim 14, wherein the first suspension layer, the second suspension layer, and the third suspension layer comprise different materials.

18. A semiconductor structure, comprising:

a first substrate overlying a base structure;

a movable component over the base structure; and a suspension structure arranged between the movable component and a sidewall of the first substrate, wherein the suspension structure comprises a first suspension layer and a second suspension layer, wherein in a top view, the first suspension layer comprises a first segment extending from the sidewall of the first substrate in a first direction and a second segment extending from the first segment in a second direction substantially orthogonal to the first direction, and wherein the second suspension layer comprises a plurality of third segments laterally offset from one another and interleaved with portions of the second segment along the second direction, wherein a length of an individual third segment of the plurality of third segments along the second direction is less than a lateral distance between adjacent segments in the plurality of third segments.

19. The semiconductor structure of claim 18, wherein the first suspension layer comprises silicon and the second suspension layer comprises a metal or a polymer.

20. The semiconductor structure of claim 18, wherein the suspension structure further comprises a third suspension layer, wherein the third suspension layer comprises a pair of elongated segments extending along opposing sidewalls of the second segment along the second direction in the top view, wherein the plurality of third segments are spaced between the pair of elongated segments.

* * * * *